United States Patent
Nagasaka et al.

(10) Patent No.: US 6,943,402 B2
(45) Date of Patent: Sep. 13, 2005

(54) NONVOLATILE SEMICONDUCTOR MEMORY DEVICE INCLUDING MOS TRANSISTORS EACH HAVING A FLOATING GATE AND CONTROL GATE

(75) Inventors: Shigeru Nagasaka, Tokyo (JP); Fumitaka Arai, Yokohama (JP); Akira Umezawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 78 days.

(21) Appl. No.: 10/642,753

(22) Filed: Aug. 19, 2003

(65) Prior Publication Data

US 2004/0238880 A1 Dec. 2, 2004

(30) Foreign Application Priority Data

May 30, 2003 (JP) .................................... 2003-155474

(51) Int. Cl.$^7$ .............................................. H01L 29/788
(52) U.S. Cl. ...................... 257/316; 257/390; 257/211; 257/299; 257/300; 257/532; 438/128; 438/129; 438/239
(58) Field of Search ................................ 257/316, 390, 257/391, 211, 299, 300, 532; 438/128, 129, 239

(56) References Cited

U.S. PATENT DOCUMENTS 5,757,714 A * 5/1998 Choi et al. .................. 365/226
5,861,648 A * 1/1999 Shinozaki .................... 257/299
6,583,492 B2 * 6/2003 Otsuki ........................ 257/535

OTHER PUBLICATIONS

M. Togo et al., "Low–Leakage and Highly–Reliable 1.5nm SiON Gate–Dieletric Using Radical Oxynitridation for Sub–0.1μm CMOS", Silicon Systems Research Labs., NEC.C (Japan), 2000 Symposium on VLSI Technology Digest of Technical Papers, 2000, pp. 116–117.

Wei–Hua Liu, et al., "A–2 Transistor Source–select (2TS) Flash EEPROM for 1.8V–Only Applications", Semiconductor Technologies Laboratory, Motorola Inc., Austin, Texas, Non–Volatile Semiconductor Memory Workshops 4.1, 1997, pp. 1–3.

* cited by examiner

*Primary Examiner*—Nathan J. Flynn
*Assistant Examiner*—Remmon R. Fordé
(74) *Attorney, Agent, or Firm*—Oblon, Spivak, McClelland, Maier & Neustadt, P.C.

(57) ABSTRACT

A nonvolatile semiconductor memory device includes memory cells including a first MOS transistor, and a boosting circuit including a capacitor element. The first MOS transistor includes a charge accumulation layer and a control gate formed on the charge accumulation layer with an inter-gate insulating film interposed therebetween. The capacitor element includes a first and a second semiconductor layers, a capacitor insulating film, and a third semiconductor layer. The first and second semiconductor layers are formed on a semiconductor substrate and separated from each other. The capacitor insulating film is formed on the top and side of each of the first and second semiconductor layers and on the semiconductor substrate between the first and second semiconductor layers and is made of the same material as that of the inter-gate insulating film. The third semiconductor layer is formed on the capacitor insulating film and is isolated electrically from the second semiconductor layer.

23 Claims, 22 Drawing Sheets

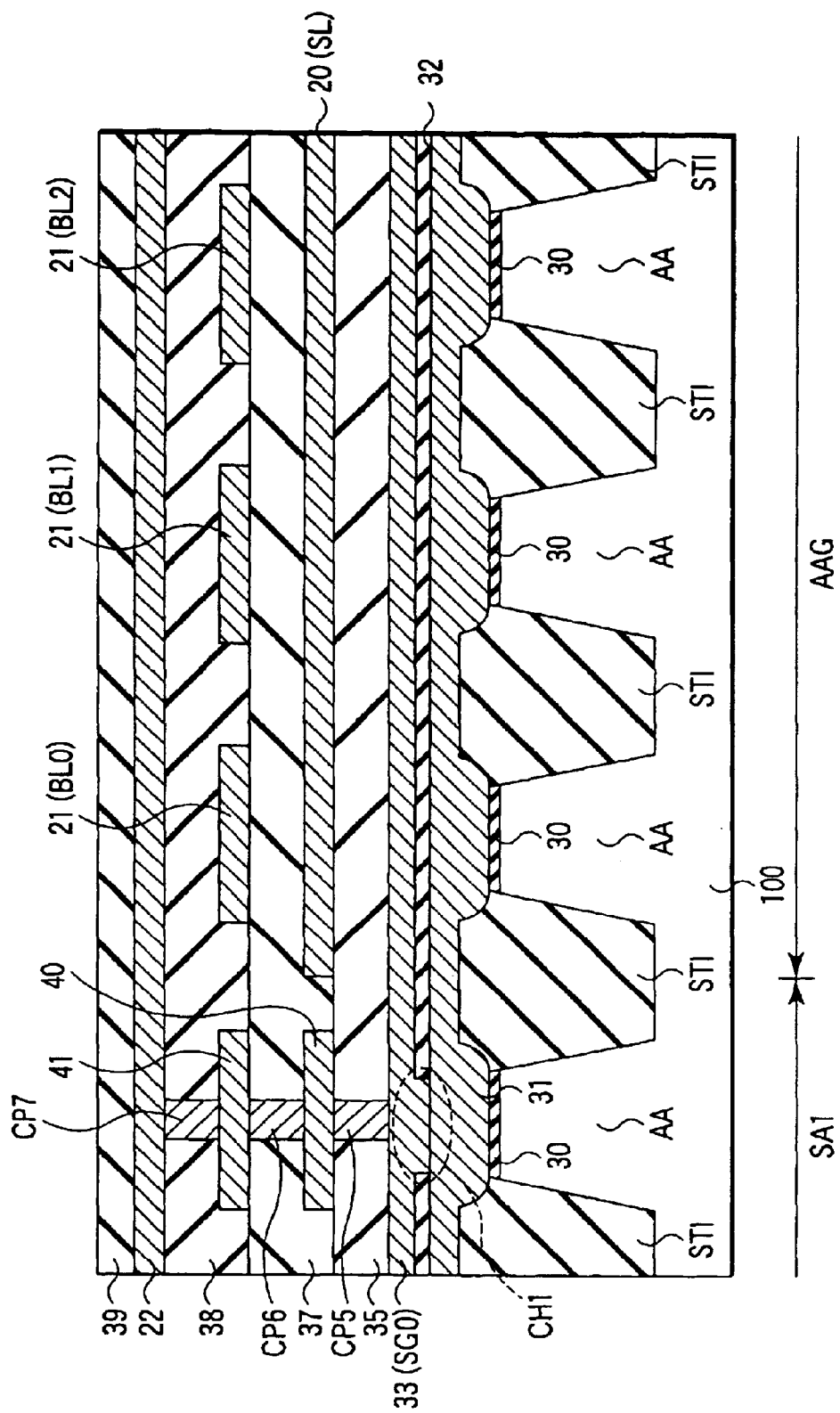
F I G. 2C

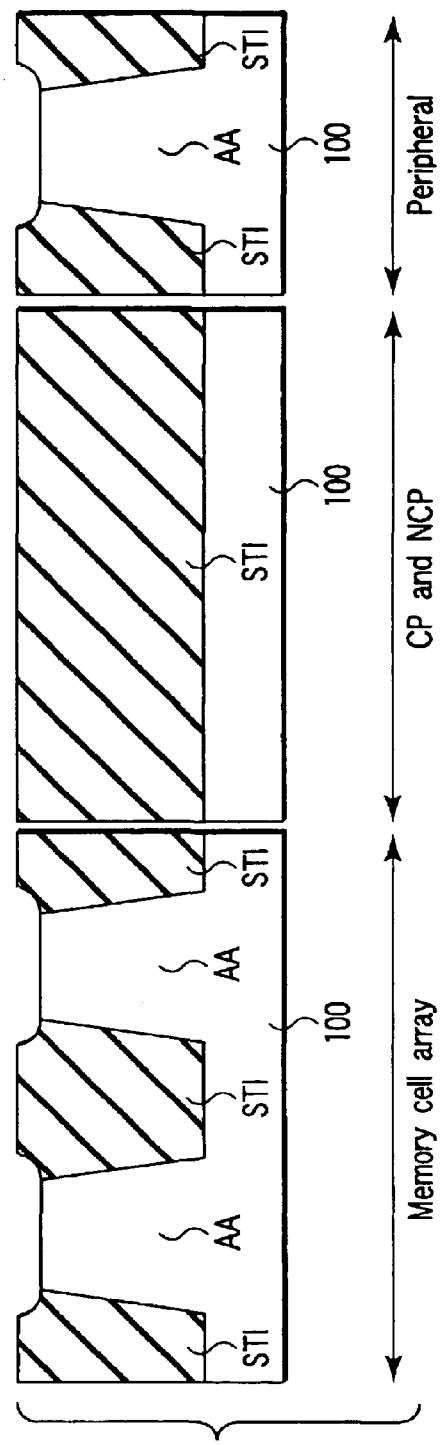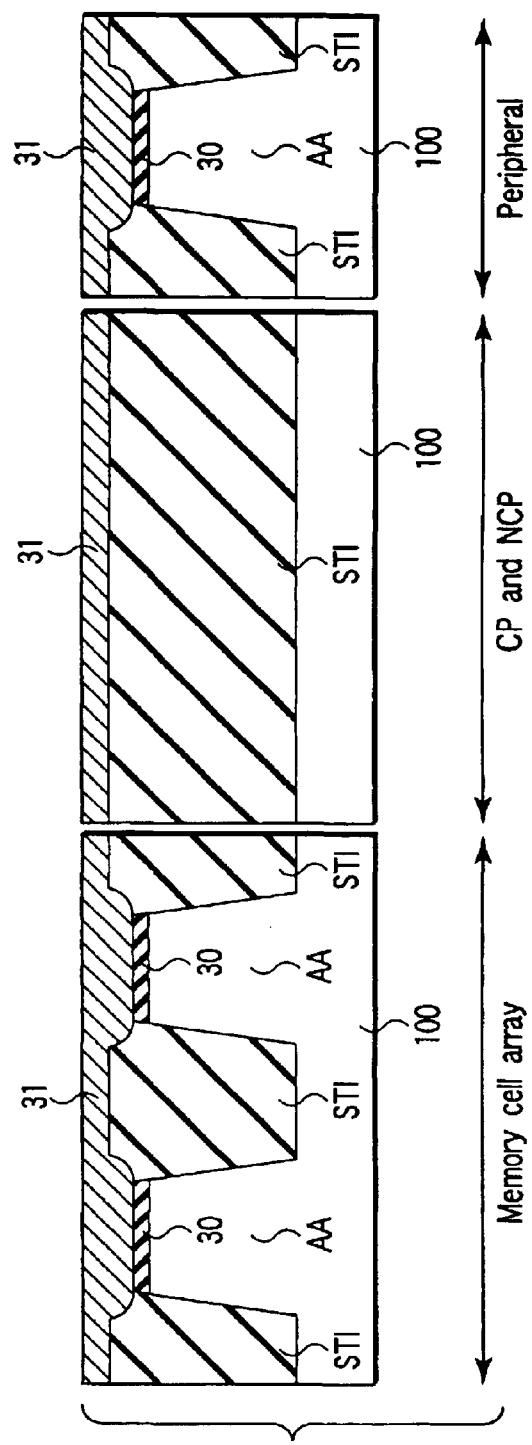
F I G. 6A
F I G. 6B

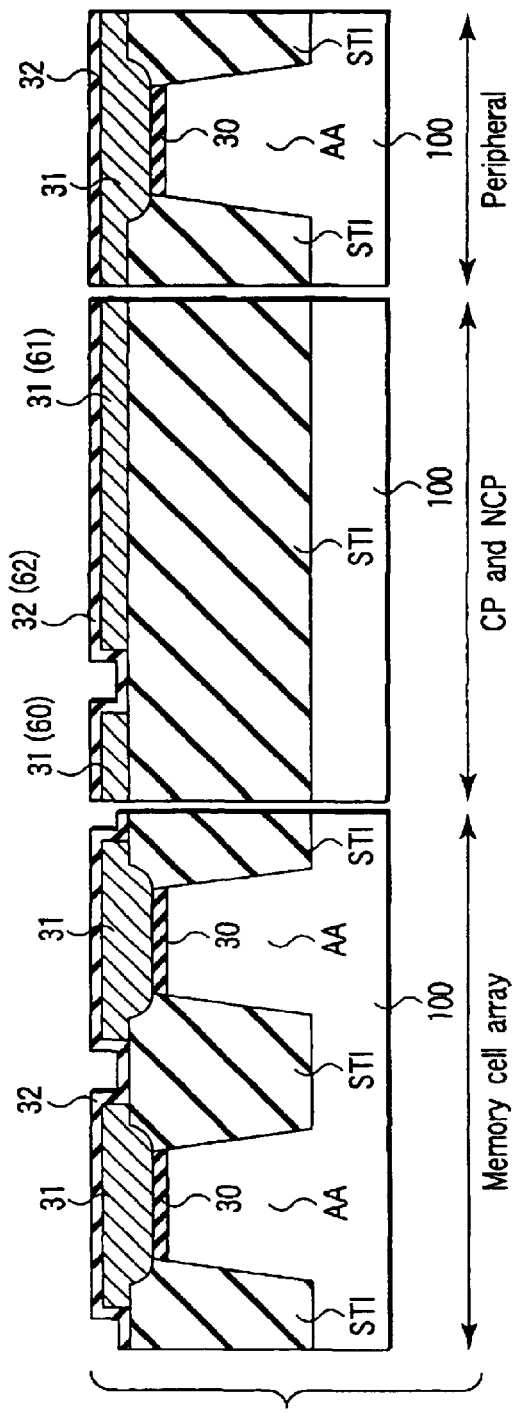
F I G. 6C
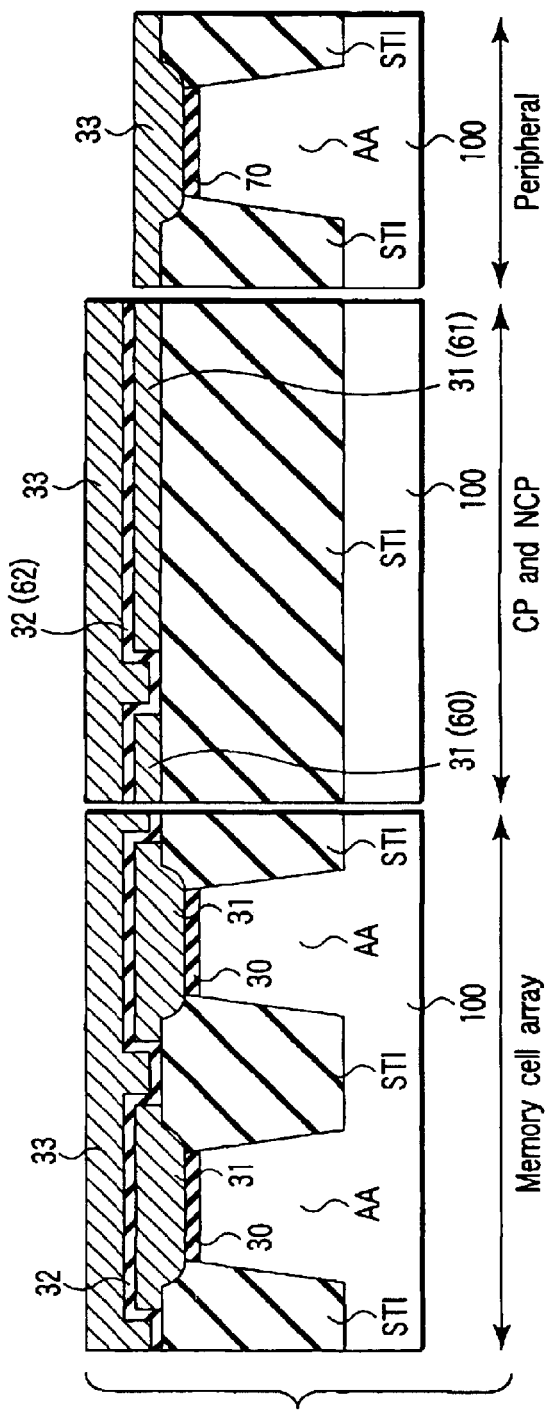
F I G. 6D

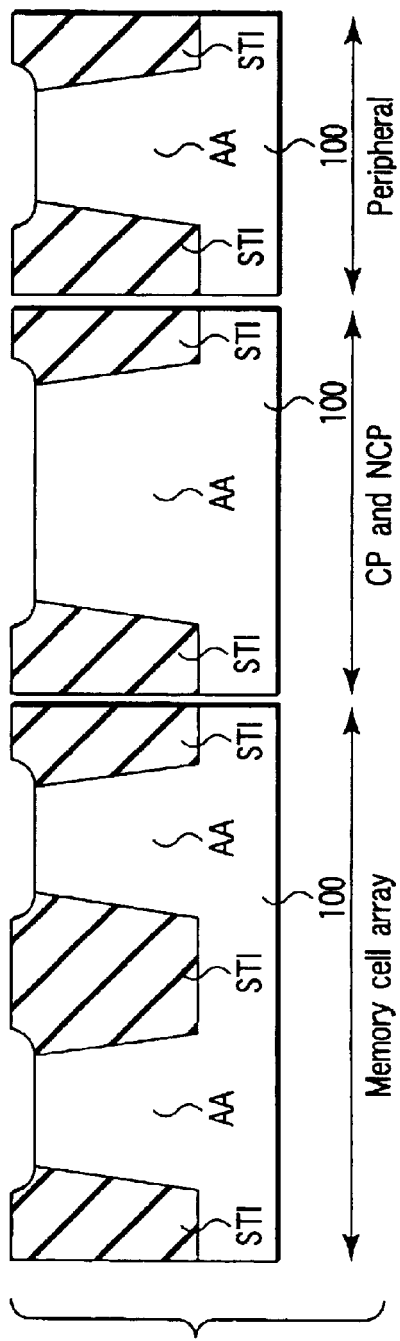
F I G. 9
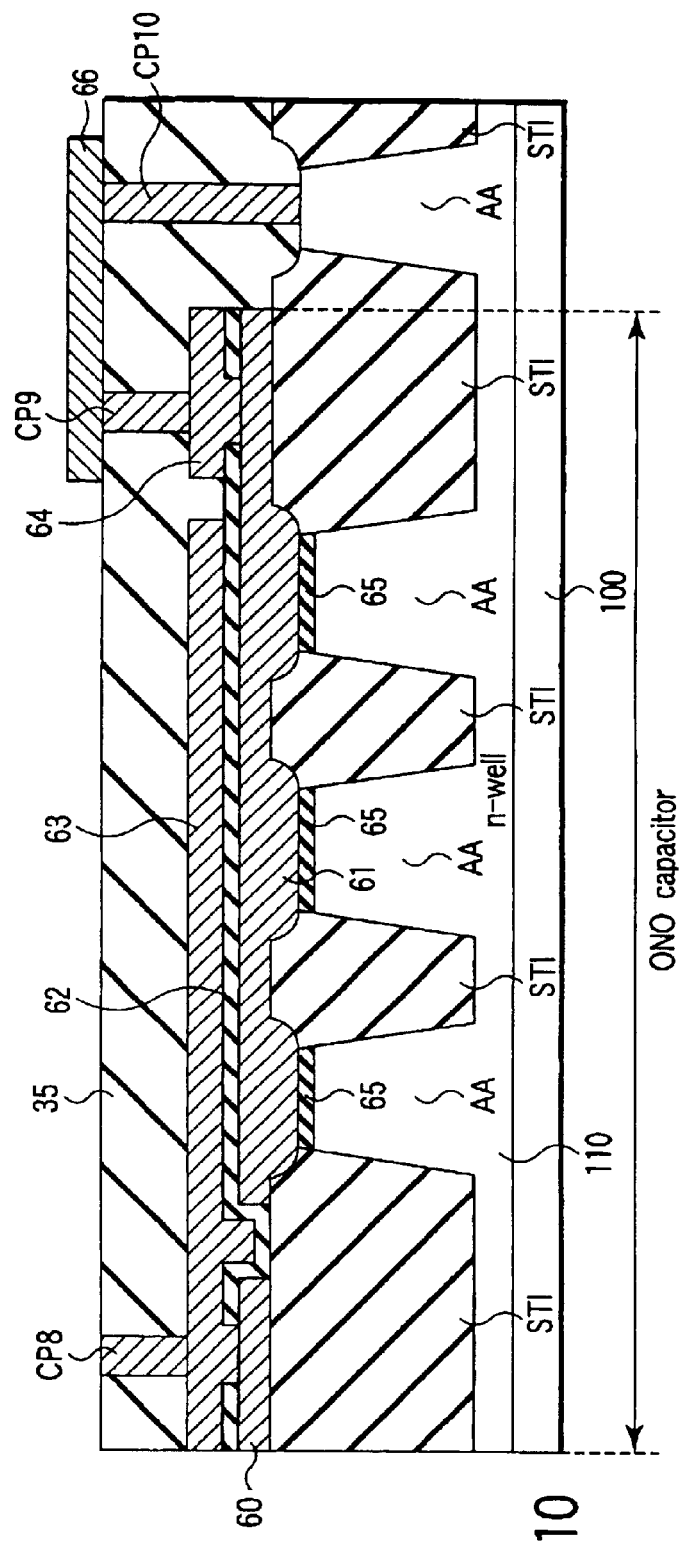
F I G. 10

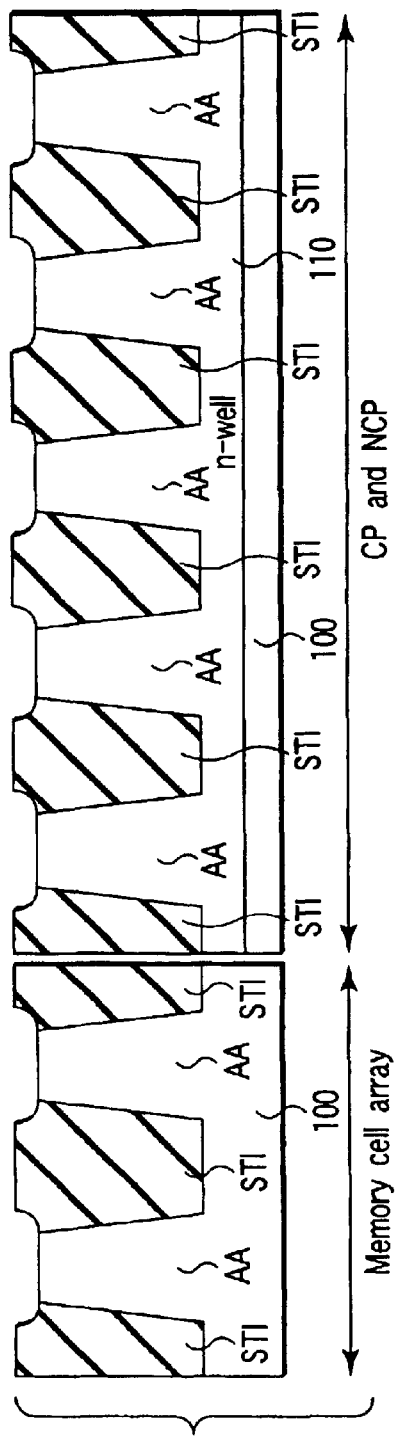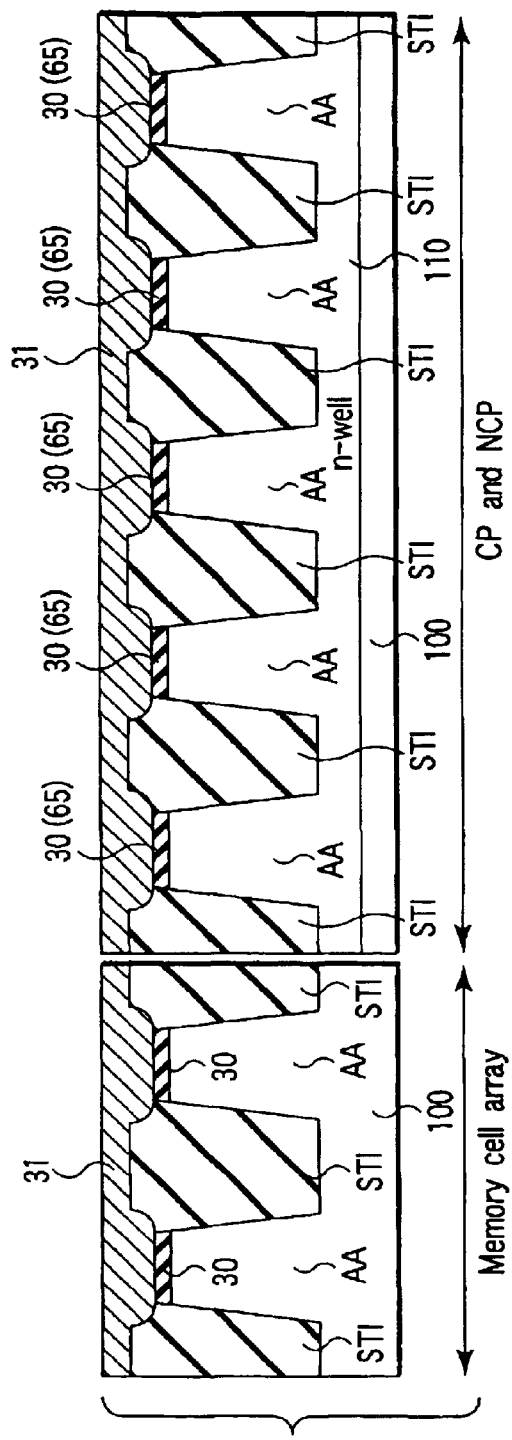
FIG. 12A
FIG. 12B

NONVOLATILE SEMICONDUCTOR MEMORY DEVICE INCLUDING MOS TRANSISTORS EACH HAVING A FLOATING GATE AND CONTROL GATE

CROSS-REFERENCE TO RELATED APPLICATIONS

This application is based upon and claims the benefit of priority from the prior Japanese Patent Application No. 2003-155474, filed May 30, 2003, the entire contents of which are incorporated herein by reference.

BACKGROUND OF THE INVENTION

1. Field of the Invention

This invention relates to a nonvolatile semiconductor memory device. More particularly, this invention relates to a nonvolatile semiconductor memory device including MOS transistors each having a floating gate and a control gate.

2. Description of the Related Art

Nonvolatile semiconductor memories, including NOR flash memories and NAND flash memories, have been widely used.

In recent years, a flash memory combining the best features of a NOR flash memory and a NAND flash memory has been proposed in, for example, Wei-Hua Liu, "A 2-Transistor Source-select (2TS) Flash EEPROM for 1.8-V-Only Application," Non-Volatile Semiconductor Memory Workshop 4.1, 1997. This flash memory has memory cells, each including two MOS transistors. In such a memory cell, one MOS transistor functioning as a nonvolatile memory section has a structure including a control gate and a floating gate and is connected to a bit line. The other MOS transistor, which is connected to a source line, is used to select a memory cell.

With the conventional flash memory, however, the characteristic of the capacitor in the boosting circuit differs from that of the memory cell. This makes it necessary to check the reliability of the memory cell and that of the capacitor in the boosting circuit in separate processes. As a result, the manufacturing processes tend to be complicated.

BRIEF SUMMARY OF THE INVENTION

A nonvolatile semiconductor memory device according to an aspect of the present invention comprises:

memory cells each of which includes a first MOS transistor having a charge accumulation layer and a control gate formed on the charge accumulation layer with an inter-gate insulating film interposed therebetween; and a boosting circuit which generates a voltage supplied to the memory cells and includes a capacitor element, the capacitor element including a first and a second semiconductor layer which are formed on a semiconductor substrate and separated from each other, a capacitor insulating film which is formed on the top and side of each of the first and second semiconductor layers and on the semiconductor substrate between the first and second semiconductor layers and which is made of the same material as that of the inter-gate insulating film, and a third semiconductor layer which is formed on the capacitor insulating film and which is connected electrically to the first semiconductor layer and isolated electrically from the second semiconductor layer.

BRIEF DESCRIPTION OF THE SEVERAL VIEWS OF THE DRAWING

FIG. 2C is a sectional view taken along line 2C—2C of FIG. 2A;

FIGS. 6A to 6H are sectional views showing sequential fabrication steps of the flash memory of the first embodiment;

FIG. 9 is a sectional view to help explain a first fabrication step of the flash memory according to the second embodiment;

FIG. 10 is a sectional view of a capacitor element included in a boosting circuit provided in a flash memory according to a modification of the second embodiment;

FIGS. 12A to 12F are sectional views showing sequential fabrication steps of the flash memory of the third embodiment;

DETAILED DESCRIPTION OF THE INVENTION

Figure 1:
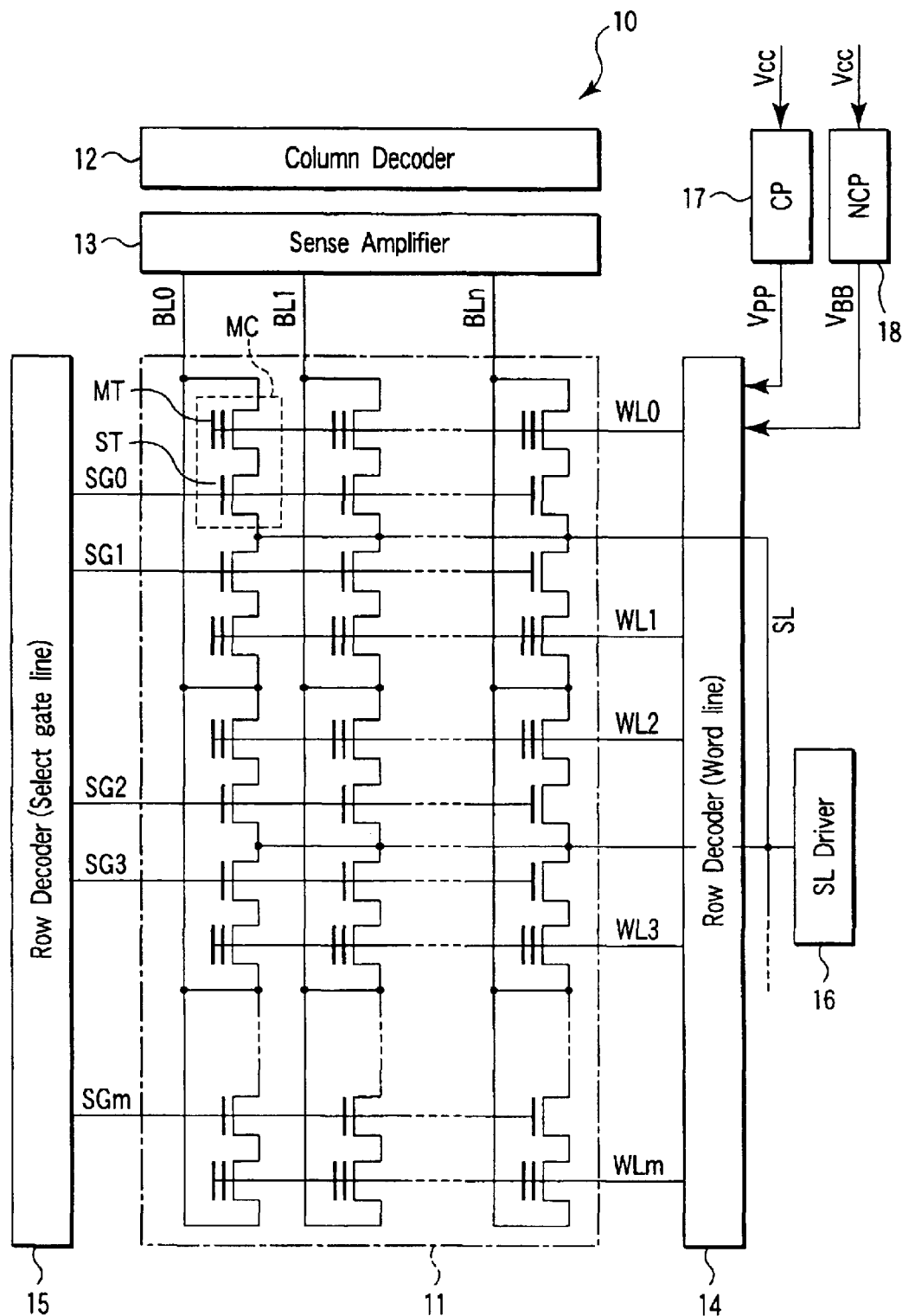
FIG. 1 is block diagram of a flash memory according to a first embodiment of the present invention.

A nonvolatile semiconductor memory device according to a first embodiment of the present invention will be explained by reference to FIG. 1. FIG. 1 is a block diagram of a flash memory according to the first embodiment.

As shown in FIG. 1, a flash memory 10 comprises a memory cell array 11, a column decoder 12, a sense amplifier 13, a first row decoder 14, a second row decoder 15, a source line driver 16, a first boosting circuit 17, and a second boosting circuit 18.

The memory cell array 11 has (m+1)×(n+1) memory cells MC (where m and n are natural numbers) arranged in a matrix. Each of the memory cells MC has a memory cell transistor MT and a select transistor ST whose current paths are connected in series with each other. The memory cell transistor MT has a stacked gate structure where a floating gate is formed on a semiconductor substrate with a gate insulating film interposed therebetween and a control gate formed on the floating gate with an inter-gate insulating film interposed therebetween. The source region of the memory cell transistor MT is connected to the drain region of the select transistor ST. Memory cells MC adjoining in the column direction share the source region of the select transistor ST or the drain region of the memory cell transistor MT.

The control gates of the memory cell transistors MT of the memory cells MC in the same row are connected in common to any one of word lines WL0 to WLm. The gates of the select transistors ST of the memory cells in the same row are connected in common to any one of select gate lines SG0 to SGm. The drains of the memory cell transistors MT of the memory cells MC in the same column are connected in common to any one of bit lines BL0 to BLn. The sources of the select transistors ST of the memory cells MC are connected in common to a source line SL, which is connected to a source line driver 16.

The column decoder 12 decodes a column address signal, thereby producing a column address decode signal. Then, the column decoder 12 selects any one of the bit lines BL0 to BLn on the basis of the column address decode signal.

The first and second row decoders 14, 15 decode a row address signal, thereby producing a row address decode signal. Then, the first row decoder 14 selects any one of the word lines WL0 to WLm in a write operation. The second row decoder 15 selects any one of the select gate lines SG0 to SGm in a read operation.

The sense amplifier 13 amplifies the data read from the memory cell MC selected by the second row decoder 15 and column decoder 12.

The source line driver 16 supplies a voltage to the source line SL in a read operation.

The first and second boosting circuits 17, 18 generate a positive high voltage Vpp (about 12 V) and a negative high voltage (about −8 V) from a power supply voltage Vcc (about 1.5 V), respectively.

Figure 2A:
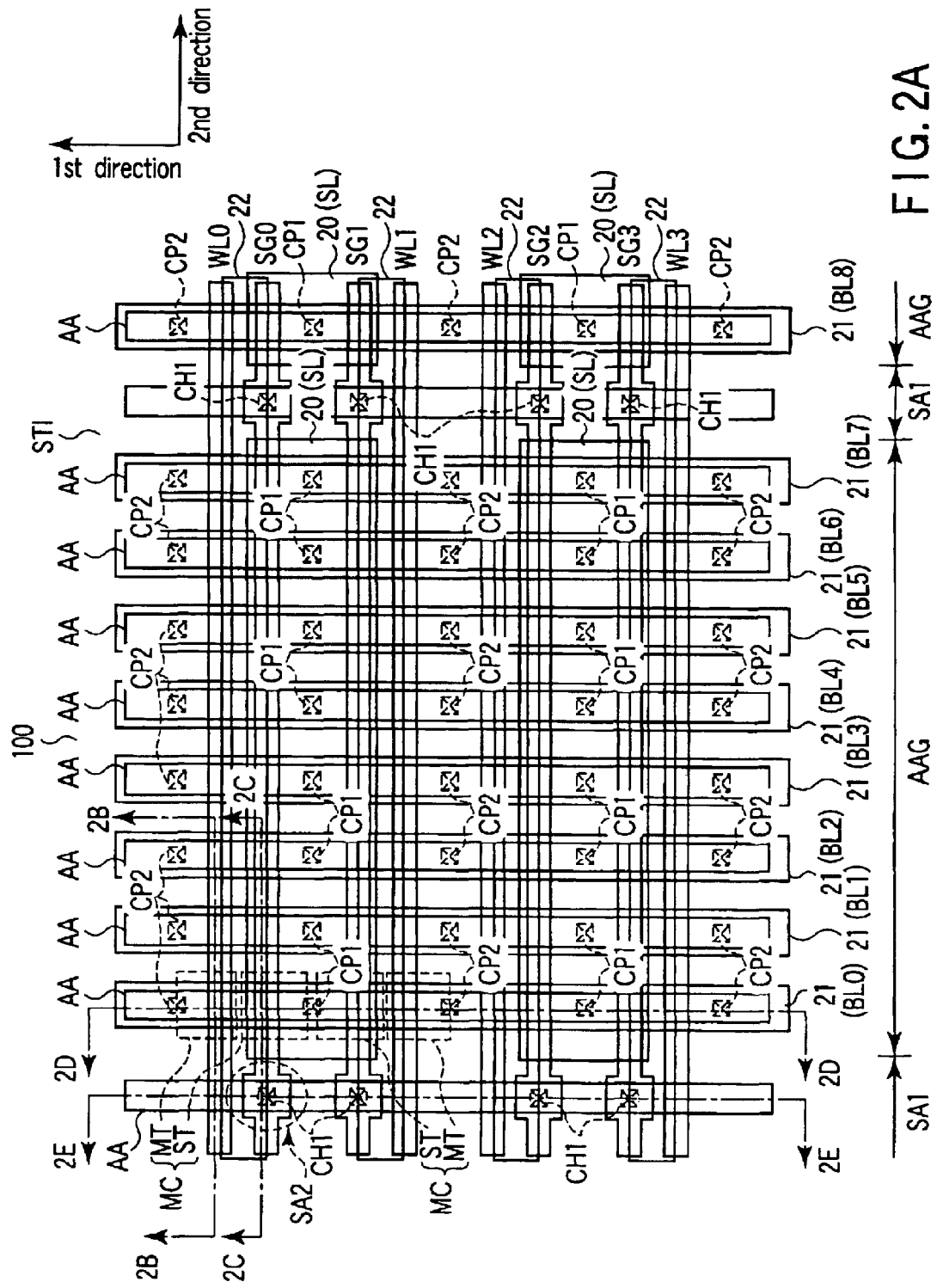
FIG. 2A is a plan view of a memory cell array provided in the flash memory of the first embodiment.

A plane pattern of the memory cell array 11 will be explained by reference to FIG. 2A. FIG. 2A is a plan view of a part of the memory cell array 11.

As shown in FIG. 2A, a plurality of stripe-shaped element regions AA extending in a first direction are formed in a semiconductor substrate 100 in a second direction perpendicular to the first direction. Then, stripe-like word lines WL0 to WLm and select gate lines SG0 to SGm extending in the second direction are formed in such a manner that they cross a plurality of element regions AA. In the regions where the word lines WL0 to WLm and the element regions AA cross one another, memory cell transistors MT are formed. In the regions where the select gate lines SG0 to SGm and the element regions AA cross one another, select transistors ST are formed. In the regions where the word lines WL0 to WLm and the element regions AA cross one another, floating gates (not shown) isolated from one another on a memory cell transistor MT basis are formed.

As described above, adjacent memory cells MC have neighboring select gate lines SG or word lines WL. A group of eight columns of element regions AA is referred to as an element region group AAG. Between adjacent element region groups AAG, a region where a column of element regions AA is formed is referred to as a stitch region SA1. The memory cells MC formed in an element region group AAG are used to store data. The memory cells MC in the stitch region SA1, which are dummy memory cells, are not used to store data. In the stitch region SA1, the select gates SG0 to SGm are so formed that part of them are wider than the rest. Hereinafter, the regions are referred to as shunt regions SA2. Like the memory cell transistor MT, the select transistor ST has a control gate and a floating gate. However, the select transistor ST differs from the memory cell transistor MT in that the floating gate is connected in common to adjacent select transistors in the second direction and that the floating gate is connected to the control gate via a contact hole CH1 made in the stitch region SA1.

Between adjacent select gate lines SG (between SG0 and SG1, between SG2 and SG3, . . . ), a stripe-like metal wiring layer 20 extending in the second direction is formed. The metal wiring layer 20 is to be part of a source line. The metal wiring layer 20 is isolated by stitch regions SA1 in the longitudinal direction (or the second direction). That is, the metal wiring layer 20 is independent in each element region group AAG. The metal wiring layer 20 is connected to the source region of a select transistor ST via a contact plug CP1. The individual metal wiring layers 20 are connected in common in a region (not shown), which is further connected to the source line driver 16.

In the element region group AAG, a stripe-like metal wiring layer 21 extending in the first direction is formed on the element region AA. The individual metal wiring layers 21, which function as bit lines BL0 to BLn, are connected to the drain region of the memory cell transistor MT via contact plugs CP2.

Furthermore, stripe-like metal wiring layers 22 extending in the second direction are formed. The metal wiring layers 22 are provided in such a manner that they correspond to sets of a word line and a select gate line (a set of WL0 and SG0, a set of WL1 and SG1, . . . ) in a one-to-one correspondence. They are connected electrically to corresponding select gate lines via contact plugs (not shown). That is, the individual metal wiring layers 22 function as shunt wires for the select gate lines SG0 to SGm. Each of the metal wiring layers 22 is formed in a region between the central part of the word line WL and the central part of the select gate line SG corresponding to the word line WL. In other words, it passes through the central part of the memory cell MC. Accordingly, the metal wiring layers 22 are arranged at equal intervals in the first direction.

Figure 2B:
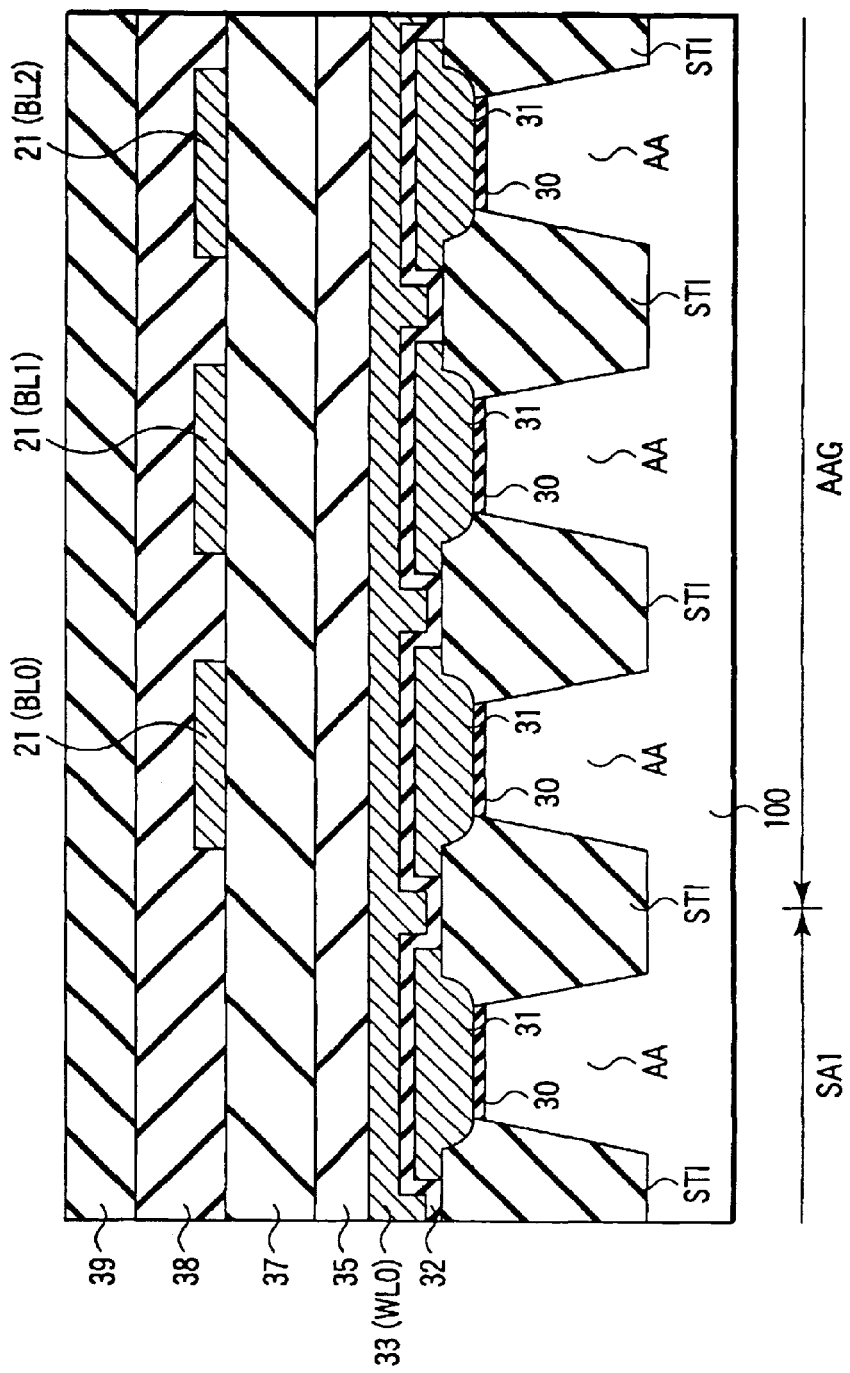
FIG. 2B is a sectional view taken along line 2B—2B of FIG. 2A.
Figure 2D:
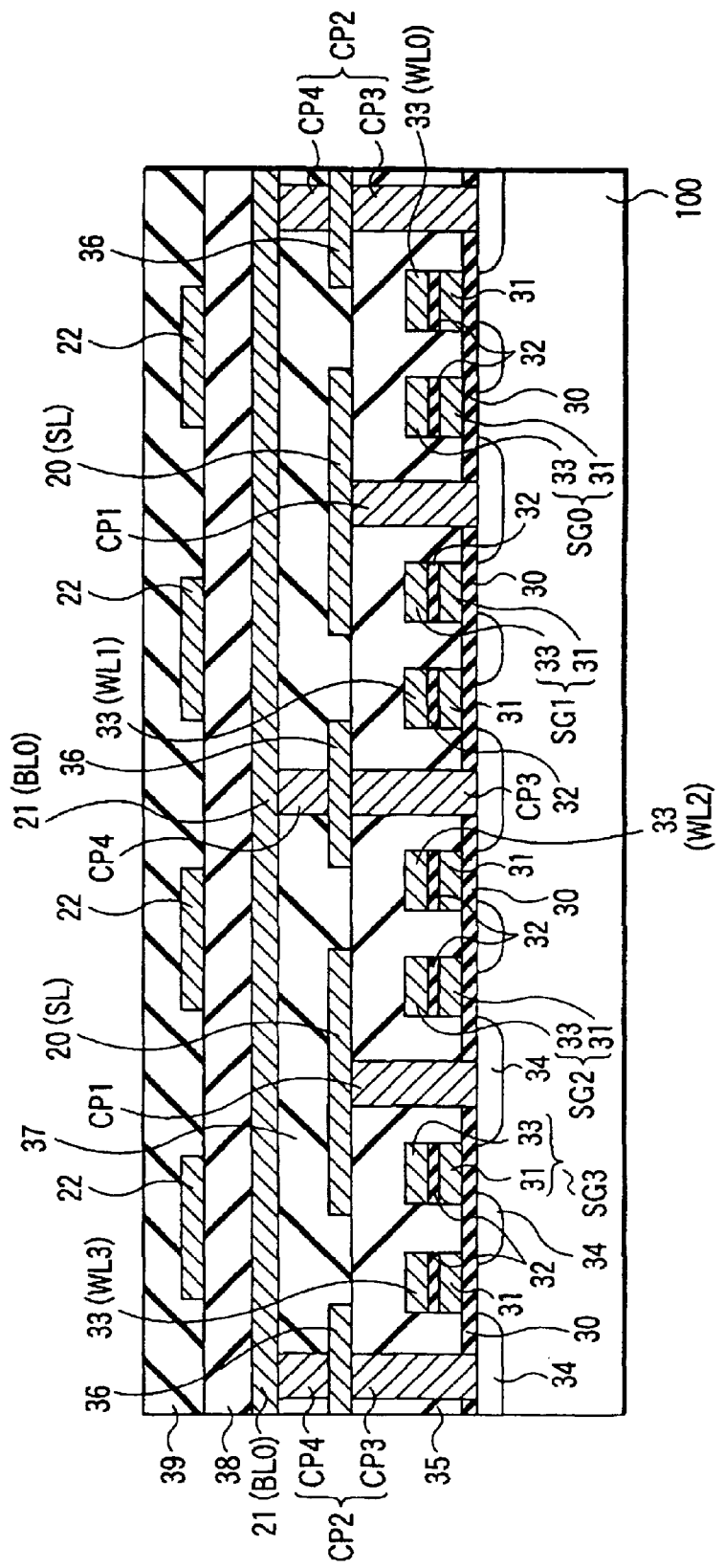
FIG. 2D is a sectional view taken along line 2D—2D of FIG. 2A.

Next, a cross-sectional structure of the flash memory configured as described above will be explained. A cross-sectional structure of the element region group AAG will be explained by reference to FIGS. 2B to 2D. FIG. 2B is a sectional view taken along line 2B—2B of FIG. 2A. FIG. 2C is a sectional view taken along line 2C—2C of FIG. 2A. FIG. 2D is a sectional view taken along line 2D—2D of FIG. 2A.

Figures 2E, 3:
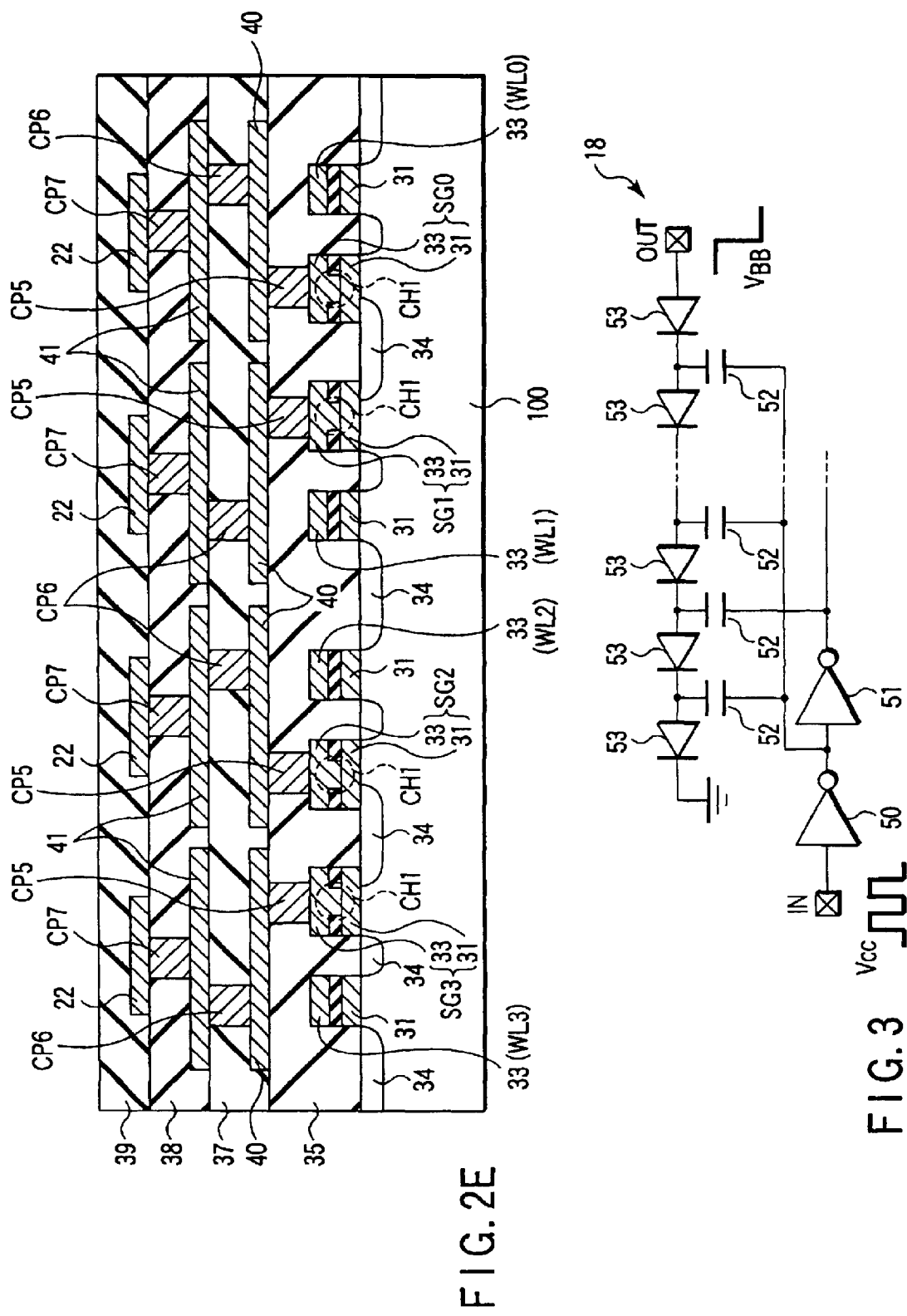
FIG. 2E is a sectional view taken along line 2E—2E of FIG. 2A.
FIG. 3 is a circuit diagram of a boosting circuit provided in the flash memory of the first embodiment.

As shown in the figures, element isolating regions STI are formed in the semiconductor substrate 100. A region enclosed by element isolating regions STI is an element region AA. A gate insulating film 30 is formed on an element region AA in the semiconductor substrate 100. The gate electrodes of a memory cell transistor MT and a select transistor ST are formed on the gate insulating film 30. The gate electrodes of the memory cell transistor MT and select transistor ST have a polycrystalline silicon layer 31 formed on the gate insulating film 30, an inter-gate insulating film 32 formed on the polycrystalline silicon layer 31, and a polycrystalline silicon layer 33 formed on the inter-gate insulating film 32. The inter-gate insulating film 32 is made of, for example, a silicon oxide film or a film with a stacked structure of a silicon oxide film and a silicon nitride film, that is an ON film, an NO film, or an ONO film. As shown in FIG. 3, the polycrystalline silicon layer 31, which is isolated from another one between adjacent element regions AA, functions as a floating gate in the memory cell transistor MT. The polycrystalline silicon layer 33, which also functions as a control gate (or word line WL), is connected in common between adjacent element regions AA. In the select transistor ST, the polycrystalline silicon layers 31 are connected in common between adjacent element regions AA. In the shunt region, a part of the inter-gate insulating film 32 is removed, thereby connecting the polycrystalline silicon layers 31, 33 electrically. Then, the polycrystalline silicon layers 31, 33 function as a select gate line SG. An impurity diffused layer 34 is formed in the surface of the semiconductor substrate 100 located between adjacent gate electrodes. The impurity diffused layer 34 is shared by adjacent transistors.

As described above, memory cells MCs including memory cell transistors MT and select transistors ST are formed so as to have the following relationship. Adjacent memory cells MC, MC have their select transistors ST adjacent to each other or their memory cell transistors MT adjacent to each other. They share an impurity diffused layer 34. Thus, when the select transistors ST are adjacent to each other, the two adjacent memory cells MC, MC are arranged symmetrically, centering on the impurity diffused layer 34 shared by the two select transistors ST, ST. Conversely, when the memory cell transistors MT are adjacent to each other, the two adjacent memory cells MC, MC are arranged symmetrically, centering on the impurity diffused layer 34 shared by the two memory cell transistors MT, MT.

Then, an interlayer insulating film 35 is formed on the semiconductor substrate 100 so as to cover the memory cell transistors MT and select transistors ST. Contact plugs CP1 reaching the impurity diffused layer (source region) 34 shared by two select transistors ST, ST are formed in the interlayer insulating film 35. Then, a metal wiring layer 20 connected to the contact plug CP1 is formed on the interlayer insulating film 35. The metal wiring layer 20 functions as a source line SL. Further a contact plug CP3 reaching the impurity diffused layer (drain region) 34 shared by two memory cell transistors MT, MT is formed in the interlayer insulating film 35. A metal wiring layer 36 connected to the CP3 is formed on the interlayer insulating film 35.

An interlayer insulating film 37 is formed on the interlayer insulating film 35 so as to cover the metal wiring layers 20, 36. Contact plugs CP4 reaching the metal wiring layer 36 are formed in the interlayer insulating film 37. The contact plugs CP3, CP4 correspond to the contact plugs CP2 in FIG. 2A. A metal wiring layer 21 connected in common to a plurality of contact plugs CP4 is formed on the interlayer insulating film 37. The metal wiring layer 21 functions as a bit line BL.

An interlayer insulating film 38 is formed on the interlayer insulating film 37 so as to cover the metal wiring layers 21. Metal wiring layers 22 are formed on the interlayer insulating film 38. Then, an interlayer insulating film 39 is formed on the interlayer insulating film 38 so as to cover the metal wiring layers 22.

Next, a cross-sectional structure of the stitch region SA will be explained by reference to FIGS. 2B, 2C, and 2E. FIG. 2E is a sectional view taken along line 2E—2E of FIG. 2A.

As shown in the figures, the floating gates and control gates of memory cell transistors and the gate electrodes of select transistors are formed on the semiconductor substrate 100. In a select transistor, part of the inter-gate insulating film 32 is removed, thereby making a contact hole CH1. Through this region, the polycrystalline silicon layers 31, 33 of the select transistor are connected. Contact holes CP5 reaching the polycrystalline silicon layer 33 of the select transistor are formed in the interlayer insulating film 35. Metal wiring layers 40 connected to the contact holes CP5 are formed on the interlayer insulating film 35. An interlayer insulating film 37 is formed so as to cover the metal wiring layer 40. Contact plugs CP6 reaching the metal wiring layer 40 are formed in the interlayer insulating film 37. Metal wiring layers 41 connected to the contact plug CP6 are formed on the interlayer insulating film 37. An interlayer insulating film 38 is formed on the interlayer insulating film 37. In the interlayer insulating film 38, contact plugs CP7 reaching the metal wiring layer 41 are formed. Metal wiring layers 22 are formed on the interlayer insulating film 38. As shown in FIG. 2E, the metal wiring layers 22 are arranged at equal intervals on the interlayer insulating film 38. Then, an interlayer insulating film 39 is formed on the interlayer insulating film 38 so as to cover the metal wiring layers 22.

Next, the configuration of the first and second boosting circuits 17, 18 will be explained. FIG. 3 is a circuit diagram of the second boosting circuit 18. As shown in the figure, the boosting circuit 18 comprises inverters 50, 51, a plurality of capacitors 52, and a plurality of diodes 53. The input terminal of the inverter 50 is connected to the input node IN of the boosting circuit 18. The output terminal of the inverter 50 is connected to the input terminal of the inverter 51.

A plurality of diodes 53 are connected in series. The anode of the first-stage diode is connected to the output node OUT of the boosting circuit 18. The cathode of the last-stage diode is grounded. The cathodes of the odd-numbered-stage diodes 53 are connected to the output node of the inverter 50 via capacitor elements 52. The cathodes of the even-numbered-stage diodes are connected to the output node of the inverter 51 via capacitor elements 52. In the boosting circuit configured as described above, a power supply voltage Vcc is inputted to an input node IN and a negative potential VBB is outputted at the output node OUT.

Figure 4:
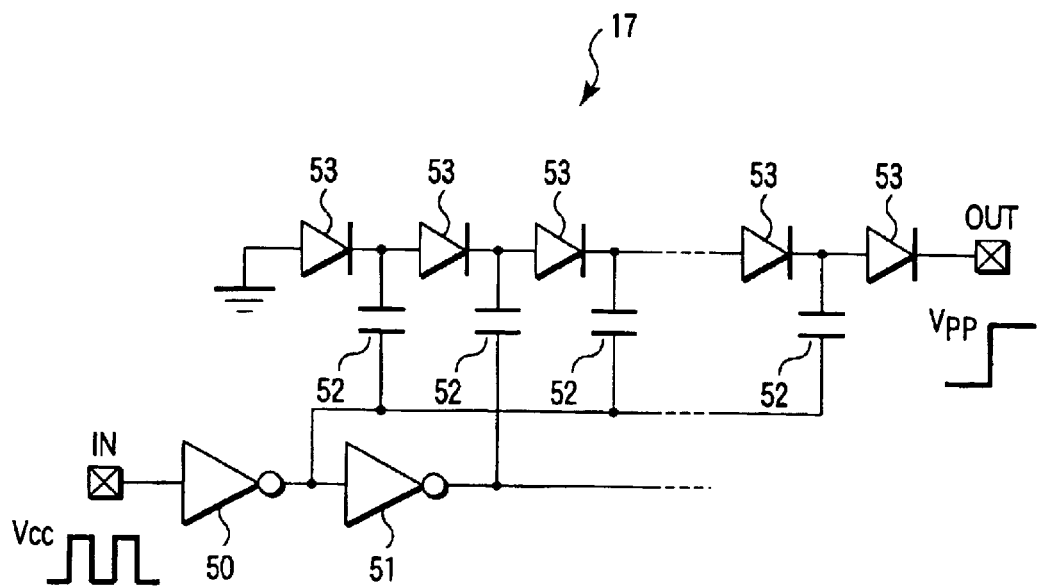
FIG. 4 is a circuit diagram of a boosting circuit provided in the flash memory of the first embodiment.

FIG. 4 is a circuit diagram of the first boosting circuit 17. As shown in the figure, the boosting circuit 17 is such that the polarity of the diodes 53 is reversed in the boosting circuit 18. The remaining configuration of the boosting circuit 17 is the same as that of the boosting circuit 18. A positive potential Vpp is outputted at the output node OUT.

Figure 5:
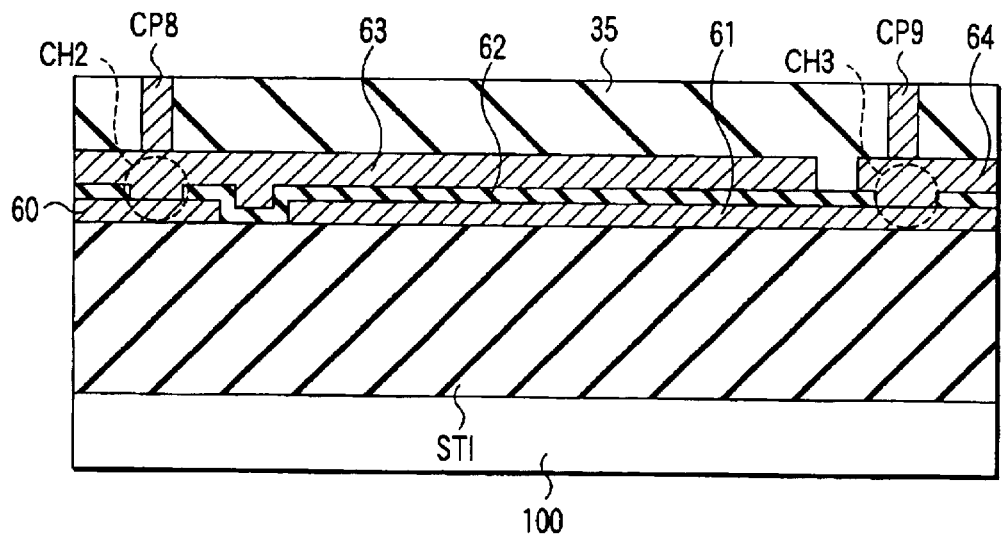
FIG. 5 is a sectional view of a capacitor element included in the boosting circuit provided in the flash memory of the first embodiment.

FIG. 5 is a sectional view of a capacitor element 52 provided in the boosting circuits 17, 18 configured as described above. As shown in the figure, an element isolating region STI is formed in the semiconductor substrate 100. Polycrystalline silicon layers 60, 61 separated from each other are formed on the element isolating region STI. A capacitor insulating film 62 is formed on the top and side of each of the polycrystalline silicon layers 60, 61 and on the element isolating region ST1 between the polycrystalline silicon layers 60, 61. The capacitor insulating film 62 is made of the same material as that of the intergate insulating film 32 of the memory cell, such as an ON film, an No film, or an ONO film. Furthermore, polycrystalline silicon layers 63, 64 separated from each other are formed on the capacitor insulating film 62. Part of the capacitor insulating film 62 is removed, thereby making contact holes CH2, CH3. Through the contact hole CH2, the polycrystalline silicon layers 60, 63 are connected. Through the contact hole CH3, the polycrystalline silicon layers 61, 64 are connected. In the above configuration, the polycrystalline silicon layer 61 functions as one electrode of the capacitor element 52, whereas the polycrystalline silicon layers 60, 63 function as the other electrode of the capacitor element 52.

In addition, an interlayer insulating film 35 is formed on the semiconductor substrate 100 so as to cover the capacitor element 52 configured as described above. In the interlayer insulating film 35, contact plugs CP8, CP9 are formed so as to be connected to the polycrystalline silicon layers 63, 64, respectively. One of the contact plugs CP8, CP9 is connected to one of the inverters 50, 51. The other of the contact plugs CP8, CP9 is connected to the diode 53.

Next, the operation of the flash memory configured as described above will be explained.

<Write Operation>

The data is written simultaneously into all of the memory cells connected to any one of the word lines. Then, "0" data or "1" data is written, depending on whether electrons are injected into the floating gate of the memory cell transistor MT. Electrons are injected into the floating gate by Fowler-Nordheim (FN) tunneling.

Hereinafter, a write operation will be explained in detail by reference to FIG. 1.

In FIG. 1, write data ("1" or "0") is inputted from the I/O terminal (not shown). Then, the write data is inputted to a latch circuit (not shown) provided for each bit line. If "1" data is stored in the latch circuit, 0 V is applied to the bit line. Conversely, if "0" data is stored, VBB (–8 V) is applied to the bit line. The negative voltage VBB is supplied from the second boosting circuit 18.

Then, the first row decoder 14 selects any one of the word lines WL0 to WLm. Thereafter, the first row decoder 14 applies the Vpp (e.g., 12 V) supplied from the first boosting circuit 17 to the selected word line. The second row decoder 15 applies the VBB (–8 V) supplied from the second boosting circuit 18 to the select gate lines SG0 to SGm. The substrate of the memory cells is also placed at VBB (–8 V). Thus, all of the select transistors ST are turned off. As a result, the memory cell transistors MT are electrically disconnected from the source line SL.

As a result, a potential corresponding to "1" data or "0" data is applied to the drain regions of the memory cell transistors MT via the bit lines BL0 to BLn. Then, Vpp (12 V) is applied to the selected word line WL, 0 V is applied to the drain regions of the memory cell transistors MT into which "1" data is to be written, and VBB (–8 V) is applied to the drain regions of the memory cell transistors MT into which "0" data is to be written. Thus, since the potential difference (12 V) between the gate and drain of the memory cell transistor MT into which "1" data is to be written is not sufficient, electrons are not injected into the floating gate, with the result that the memory cell transistor MT holds a negative threshold value. On the other hand, since the potential difference (20 V) between the gate and drain of the memory cell transistor MT into which "0" data is to be written is large, electrons are injected into the floating gate by FN tunneling. As a result, the threshold value of the memory cell transistor MT becomes positive.

<Read Operation>

In a data read operation, the data can be read simultaneously from a plurality of memory cells connected to any one of the word lines.

Hereinafter, a read operation will be explained in detail by reference to FIG. 1.

In FIG. 1, the second row decoder 15 selects any one of the select gate lines SG0 to SGm. A high level (e.g., Vcc) is applied to the selected select gate line. A low level (e.g., 0 V) is applied to all of the unselected select gate lines. Thus, the select transistor ST connected to the selected select gate line is turned on, whereas the select transistors ST connected to the unselected select gate lines are turned off. Thus, the select transistor ST in the selected memory cell is connected electrically to the source line SL. In addition, the first row decoder 14 places all the word lines WL0 to WLm at the low level (0 V). The source line driver 16 sets the potential of the source line at 0 V.

Then, for example, a voltage of about 1 V is applied to the bit lines BL0 to BLn. Then, since the memory cell transistor MT of a memory cell MC into which "1" data has been written has a negative threshold voltage, it is in the on state. Thus, in a memory cell MC connected to the selected select gate line, current flows from the bit line to the source line SL via the current paths of the memory cell transistor MT and select transistor ST. On the other hand, since the memory cell transistor MT of a memory cell MC into which "0" data has been written has a positive threshold voltage, it is in the off state. Thus, no current flows from the bit line to the source line.

As a result, the potentials of the bit lines BL0 to BLn vary. The sense amplifier 13 amplifies the variations, thereby carrying out the read operation.

<Erase Operation>

The data is erased simultaneously from all the memory cells sharing a well region. Thus, in the example of FIG. 1, all the memory cells included in the memory cell array 11 are erased at the same time.

In FIG. 1, the first row decoder 14 applies the negative voltage VBB (–8 V) supplied from the second boosting circuit 18 to all the word lines WL0 to WLm. The potential of the semiconductor substrate (well region) is set at Vpp (12 V). As a result, electrons are extracted from the floating gates of the memory cell transistors of the memory cells MC into the semiconductor substrate by FN tunneling. As a result, the threshold voltages of all the memory cells MC become negative, thereby erasing the data.

Next, a method of fabricating the memory cells MC, the capacitor elements of the boosting circuits 17, 18, and the peripheral circuits (including the row decoder and column decoder) excluding the boosting circuits 17, 18 in the flash memory 10 configured as described above will be explained by reference to FIGS. 6A to 6H. FIGS. 6A to 6H are sectional views showing fabrication steps of the flash memory of the first embodiment sequentially. The memory cell array region in each of FIGS. 6E and 6F corresponds to the sectional view taken along line 2C—2C of FIG. 2A. The memory cell array region in each of FIGS. 6A, 6B, 6C, 6D, 6G, and 6H corresponds to the sectional view taken along line 2B—2B of FIG. 2A.

As shown in FIG. 6A, element isolating regions STI are formed in the semiconductor substrate 100 by STI (Shallow Trench Isolation) techniques. Then, in the memory cell array 11, stripe-like element regions AA are formed. Element regions AA are also formed in a peripheral circuit region. In regions where the capacitor elements 52 for the boosting circuits 17, 18 are to be formed, element regions are not formed.

As shown in FIG. 6B, a gate insulating film 30 is formed to a thickness of, for example, 8 nm on the semiconductor substrate 100 by thermal oxidation techniques. Then, a polycrystalline silicon layer 31 is formed on the gate insulating film 30 to a film thickness of 60 nm. The polycrystalline silicon layer 31 functions as the floating gate of a memory cell transistor MT.

Next, as shown in FIG. 6C, the polycrystalline silicon layer 31 is patterned by photolithographic techniques and by anisotropic etching, such as RIE (Reactive Ion Etching) techniques. As a result, in the memory cell array region, the polycrystalline silicon layer 31 is divided into parts corresponding to the individual memory cell transistors MT. At this time, in the regions where capacitor elements 52 are to be formed, too, the polycrystalline silicon layer 31 is patterned. As a result, the polycrystalline silicon layer 31 is divided in two. The divided two polycrystalline silicon layers 31, 31 correspond to the polycrystalline silicon layers 60, 61 explained in FIG. 5. Then, an ONO film 32 is formed on the polycrystalline silicon layer 31 and element isolating region STI to a film thickness of 15.5 nm by, for example, CVD techniques. Of course, an ON film or an NO film may be used in place of the ONO film. The ONO film 32 functions as an inter-gate insulating film in the memory cell array region. It also functions as the capacitor insulating film 62 in a region where the capacitor element 52 is to be formed.

Next, a photoresist is applied onto a region where the memory cell array region and capacitor element 52 are to be formed. Then, the gate insulating film 30, polycrystalline silicon layer 31, and ONO film 32 in the peripheral region are removed by etching. Thereafter, the photoresist is removed by ashing.

Next, as shown in FIG. 6D, a gate insulating film 70 is formed on the semiconductor substrate 100 in the peripheral circuit region by thermal oxidation techniques. Then, a polycrystalline silicon layer 33 is formed on the ONO film 32 and gate insulating film 70 to a film thickness of, for example, 40 nm by CVD techniques.

Figure 6E:
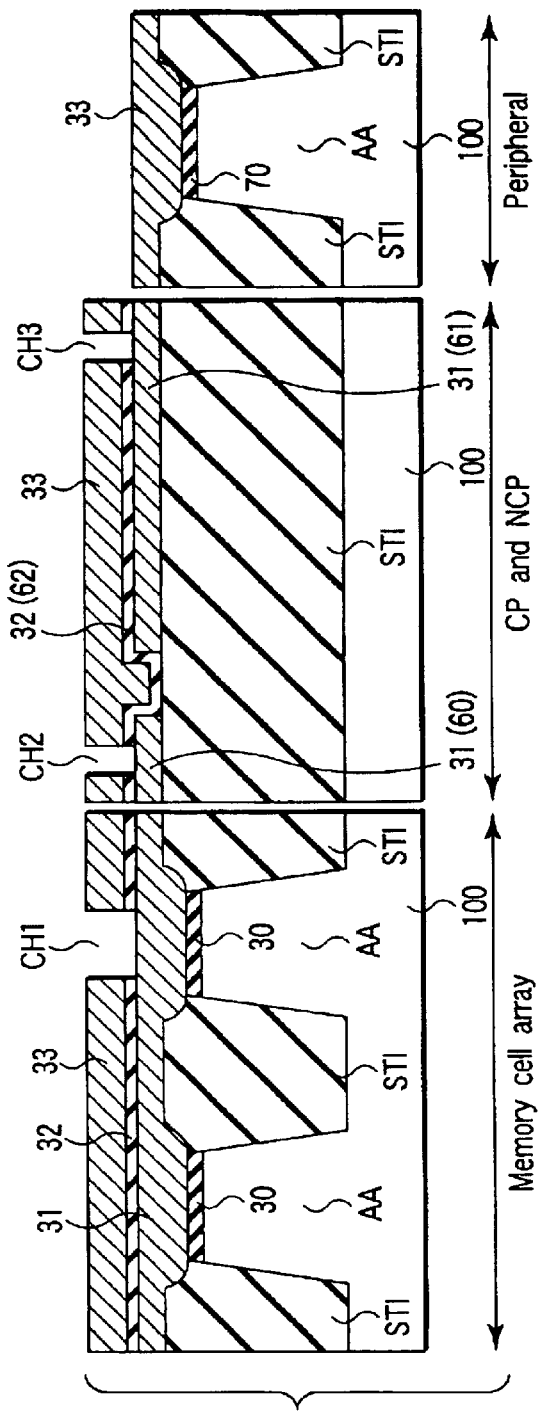

Next, as shown in FIG. 6E, the polycrystalline silicon layer 33 and ONO film 32 are etched by photolithographic techniques and RIE techniques. As a result, in the memory cell array region, a contact hole CH1 reaching the polycrystalline silicon layer 31 is made in the shunt region of the select transistor. At the same time, in the region where a capacitor element 52 is to be formed, contact holes CH2, CH3 reaching the corresponding divided polycrystalline silicon layers 31 are made.

Figure 6F:
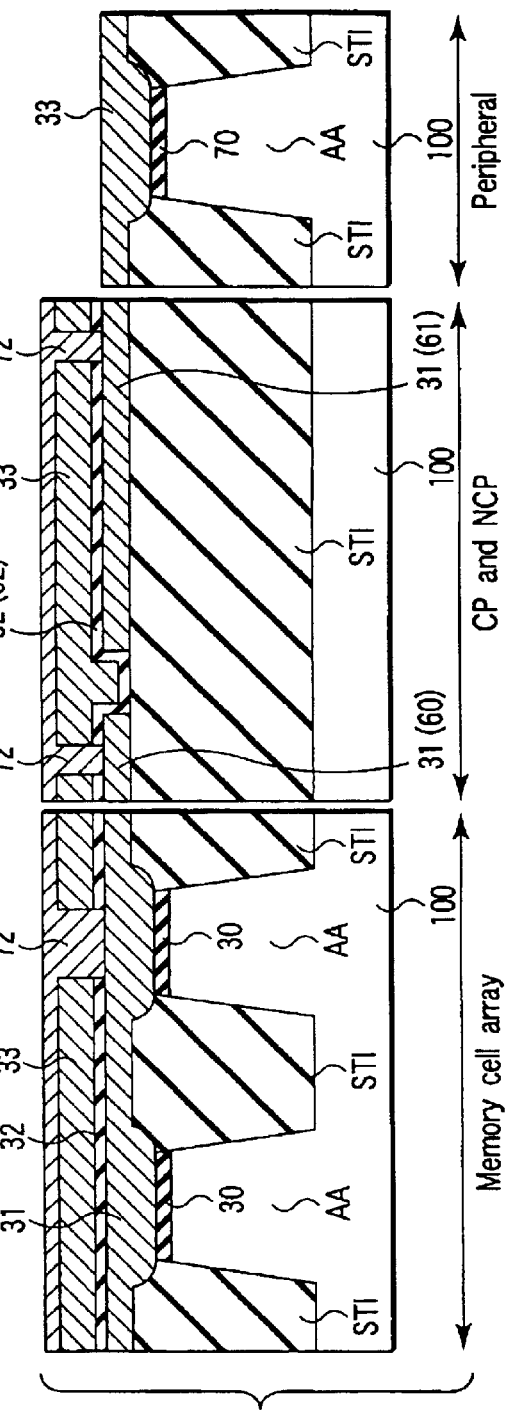

Next, as shown in FIG. 6F, a polycrystalline silicon layer 72 is formed on the polycrystalline silicon layer 33 to a film thickness of 160 nm by CVD techniques, thereby filling up the contact holes CH1 to CH3. As a result, the polycrystalline silicon layers 31, 33 are connected in the select transistor ST and capacitor element 52. The polycrystalline silicon layer 72 may also be formed in the peripheral circuit region. The polycrystalline silicon layer 72, together with the polycrystalline silicon layer 33, is the control gate of the memory cell transistor MT and part of the select gate of the select transistor.

Figures 6G, 6H:
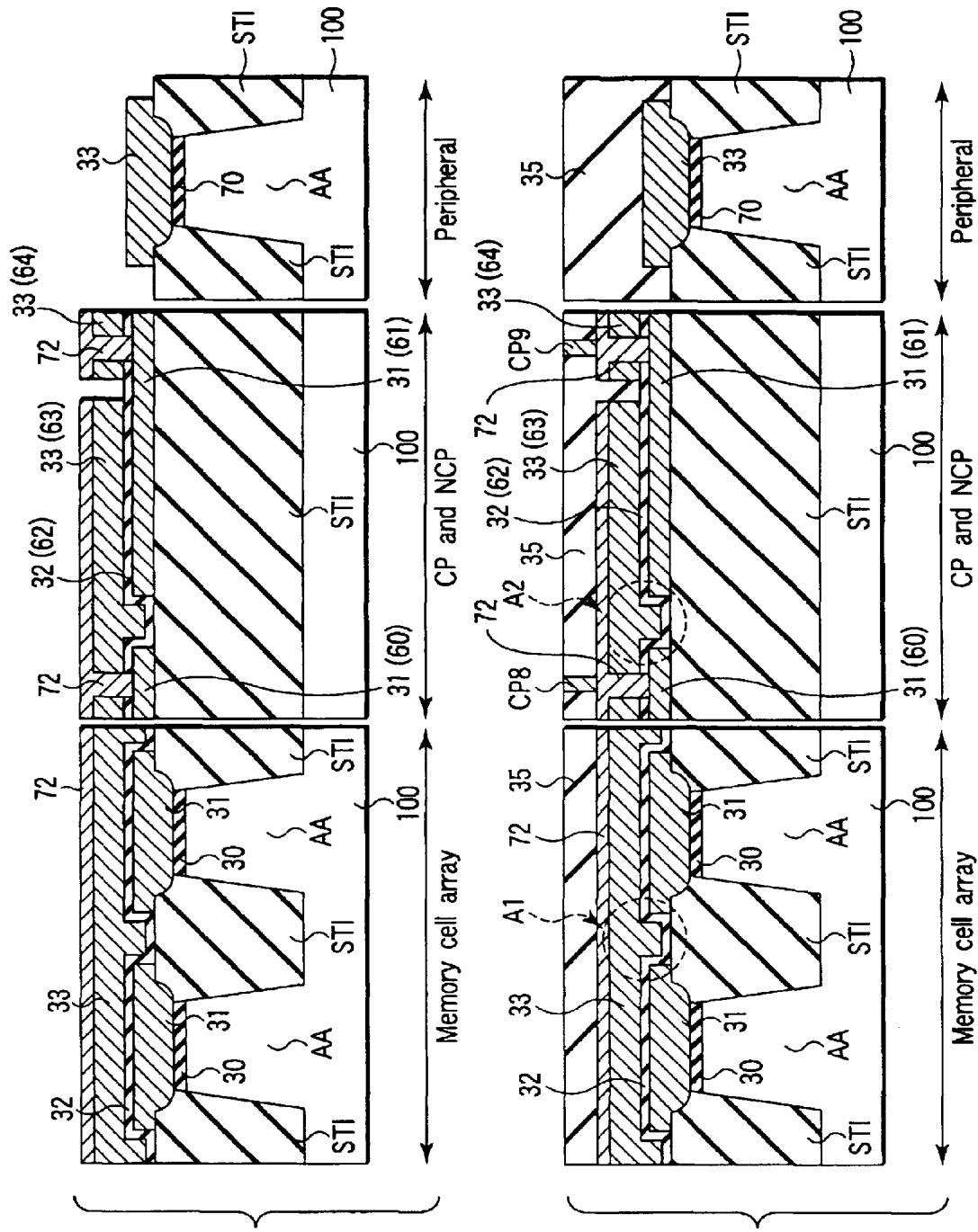

Next, in the memory cell array region, the polycrystalline silicon layers 33, 31, 72, and the inter-gate insulating film 32 are patterned by photolithographic techniques and RIE techniques, thereby forming a stripe-like multilayer gate. Then, in the peripheral circuit region, the polycrystalline silicon layer 33 is patterned into a gate electrode pattern. When the peripheral circuit region is patterned, the polycrystalline silicon layer 33 of the capacitor element 52 is patterned at the same time. As a result, as shown in FIG. 6G, the polycrystalline silicon layer 33 of the capacitor element 52 is divided in two, one (63) of which is connected to the polycrystalline silicon layer 31 (60) and the other (64) of which is connected to the polycrystalline silicon layer 31 (61).

Next, the source and drain regions of the memory cell transistor, select transistor, and the MOS transistor in the peripheral circuit region are formed by ion implantation techniques. Then, as shown in FIG. 6H, an interlayer insulating film 35 is formed on the semiconductor substrate 100 so as to cover the memory cell transistor, select transistor, capacitor element 52, and the MOS transistor in the peripheral circuit region. Then, a contact plug CP3 reaching the drain region of the memory cell transistor, a contact plug CP1 reaching the source region of the select transistor, and a contact plug reaching the source and drain regions of the MOS transistor in the peripheral circuit region are formed. Furthermore, in the shunt region of the select transistor, a contact plug CP5 reaching the polycrystalline silicon layer 33 is formed. In this case, contact plugs CP8, CP9 reaching the polycrystalline silicon layer 31 of the capacitor element 52 are formed at the same time.

Thereafter, an interlayer insulating film, a contact plug, and a metal wiring layer are formed, which completes the flash memory shown in FIGS. 2A to 2E.

As described above, the flash memory of the first embodiment produces the following effects:

(1) The process of manufacturing flash memories can be simplified. ①

Figure 7:
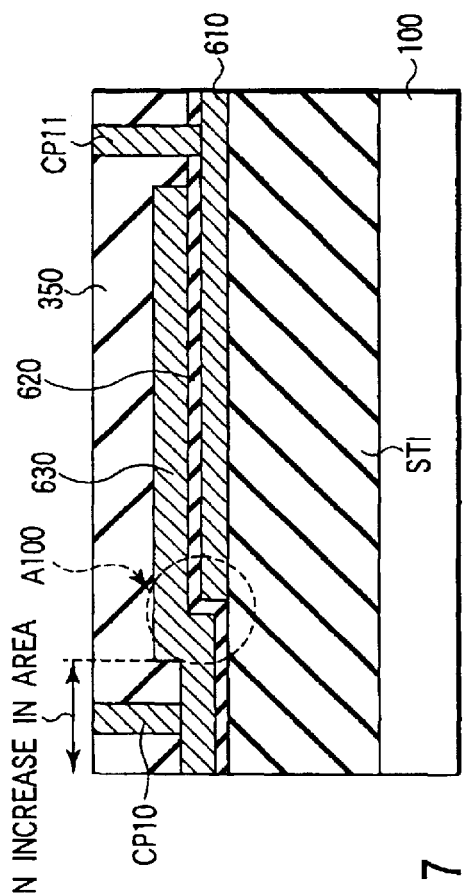
FIG. 7 is a sectional view of a capacitor element.

Generally, the shape of a memory cell differs from that of a capacitor element. When the floating gate of a flash memory is used as one electrode of a capacitor element, the inter-gate insulating film is used as a capacitor insulating film, and the control gate is used as the other electrode of the capacitor element, the structure of the capacitor element can be considered to be as shown in FIG. 7. Specifically, a polycrystalline silicon layer (floating gate) 610 is formed on an element isolating region STI. In addition, a polycrystalline silicon layer (control gate) 630 is formed on the top and sidewall of the polycrystalline silicon layer 610 and on the element isolating region STI with an ONO film (inter-gate insulating film) 620 interposed therebetween. In such a configuration, the place where an electric field concentrates most in the capacitor insulating film 620 is the region A100 of FIG. 7. Moreover, the place where an electric field concentrates most is the region A1 of FIG. 6H in the inter-gate insulating film 32 of the memory cell. That is, the shape of the place where the electric field concentrates most in the capacitor insulating film 620 differs from that in the inter-gate insulating film 32. As a result, they differ in reliability. Accordingly, it is necessary to test them separately.

In the configuration of the first embodiment, the capacitor element 52 included in each of the boosting circuits 17, 18 has the same shape in part as the memory cell. More specifically, the same structure as the region (region A1 in FIG. 6H) where the electric field concentrates most in the inter-gate insulating film 32 of the memory cell is also formed in the capacitor insulating film 62 of the capacitor element 52 (region A2 in FIG. 6H). The inter-gate insulating film 32 and capacitor insulating film 62 are both made of the same material (i.e., ONO film). Thus, the inter-gate insulating film 32 and capacitor insulating film 62 have the same dielectric breakdown strength (or dielectric breakdown voltage). In other words, they have the same reliability. Accordingly, the step of testing the reliability of the inter-gate insulating film 32 and the step of testing the reliability of the capacitor insulating film 62 can be carried out in the same step. As a result, the process of manufacturing flash memories can be simplified.

The above effect can be realized without an increase in the number of fabrication steps. For instance, as explained in FIG. 6E, the step of removing part of the capacitor insulating film 62 of the capacitor element 52 can be carried out simultaneously with the step of removing the inter-gate insulating film of the select transistor. Furthermore, as explained in FIG. 6F, the step of filling in the contact holes CH2, CH3 in the capacitor element 52 can be carried out simultaneously with the step of filling in the contact hole CH1 in the select transistor. In addition, as explained in FIG. 6G, the step of forming the polycrystalline silicon layers 63, 64 of the capacitor element (the step of dividing the polycrystalline silicon layer 33 in two) can be carried out simultaneously with the step of patterning the MOS transistors in the peripheral circuit region. As described above, the formation of the capacitor element 52 does not require an additional step.

(2) The size of the capacitor element can be decreased.

In the configuration shown in FIG. 7, a region where a contact plug CP10 connected to the other electrode of the capacitor element is to be formed is necessary, leading to an increase in the area. With the configuration of the first embodiment, however, an increase in the area resulting from the above region is avoided, which reduces the size of the capacitor size.

(3) The reliability of the capacitor element can be improved. ①

In the configuration of the first embodiment, the capacitor element 52 is formed on the element isolating region STI. Thus, the capacitance of a parasitic capacitor element including the polycrystalline silicon layer 61, element isolating region STI, and semiconductor substrate 100 is very small. Consequently, the reliability of the capacitor element 52 can be improved.

Figure 8:
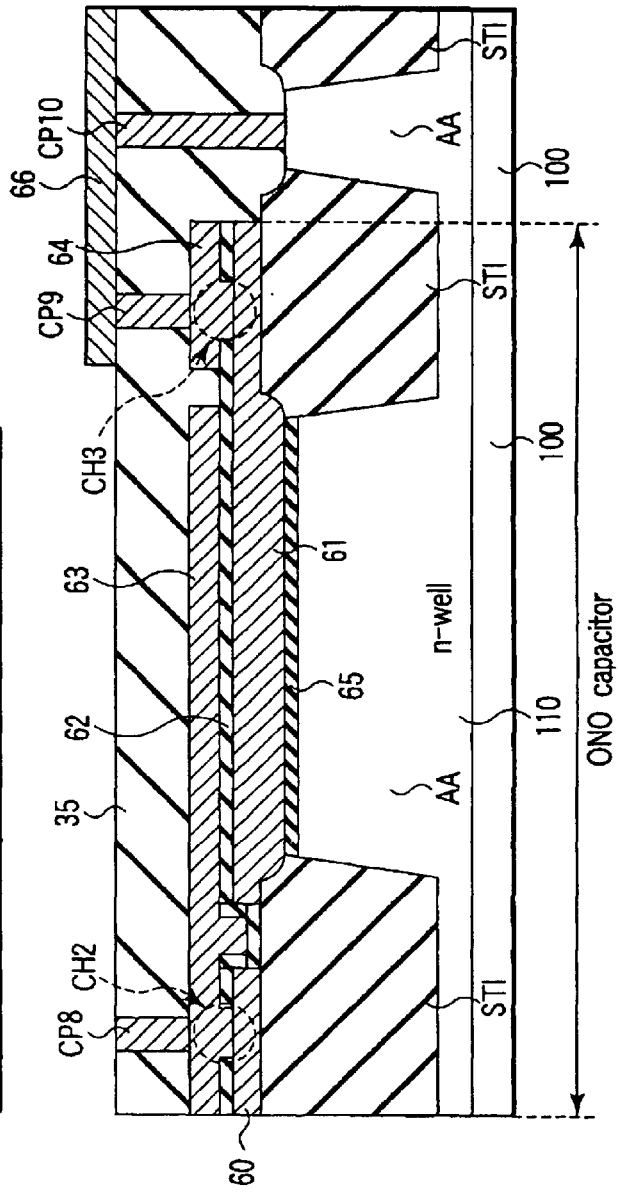
FIG. 8 is a sectional view of a capacitor element included in a boosting circuit provided in a flash memory according to a second embodiment of the present invention.

Next, a nonvolatile semiconductor memory device according to a second embodiment of the present invention will be explained. The second embodiment is such that an element region is provided below the capacitor element. Since the block diagram of a flash memory and the configuration of the memory cell array region in the second embodiment are the same as those in the first embodiment, explanation of them will be omitted. FIG. 8 is a sectional view of a capacitor element provided in each of the boosting circuits 17, 18 included in a flash memory of the second embodiment.

As shown in FIG. 8, an element region AA is formed in the semiconductor substrate 100 in the structure explained by reference to FIG. 5 in the first embodiment. An n-well 110 is formed in the silicon substrate 100. The polycrystalline silicon layer 61 is formed on the n-well region 110 with a gate insulating film 65 interposed therebetween. A polycrystalline silicon layer 60 electrically isolated from the polycrystalline silicon layer 61 is formed on the element isolating region STI.

In the capacitor element 52 configured as described above, the n-well region 110 and the polycrystalline silicon layer 61 are set at the same potential. To bring both of the well region 100 and layer 61 to the same potential, the n-well region 110 is drawn up to the surface of the semiconductor substrate 100 in a different region from the capacitor element 52. Then, the n-well 110 is connected electrically to a polycrystalline silicon layer 64 via a contact plug CP10, a metal wiring layer 66, and a contact plug CP9.

A method of fabricating a capacitor element with the above configuration is realized by also forming an element region AA in a region where a capacitor element is to be formed as shown in FIG. 9 in the step explained by reference to FIG. 6A in the first embodiment. Then, a gate insulating film 30 is also formed in the region where the capacitor element is to be formed, followed by the steps shown in FIGS. 6B to 6H, which completes a capacitor element 52 shown in FIG. 8.

As described above, the flash memory of the second embodiment produces not only the effects explained in item (1) and item (2) in the first embodiment but also the effect explained in the following item (4).

(4) The reliability of the capacitor element can be improved. ②

In the configuration of the second embodiment, the n-well region 110 and the polycrystalline silicon layer 61 are placed at the same potential. Thus, it is possible to eliminate the influence of the parasitic capacitor element including the polycrystalline silicon layer 61, gate insulating film 65, and n-well region 110, which improves the reliability of the capacitor element 52.

FIG. 10 is a sectional view of a capacitor element according to a modification of the second embodiment. As shown in FIG. 10, more than one element region AA may be formed below the polycrystalline silicon layer 61.

Figure 11A:
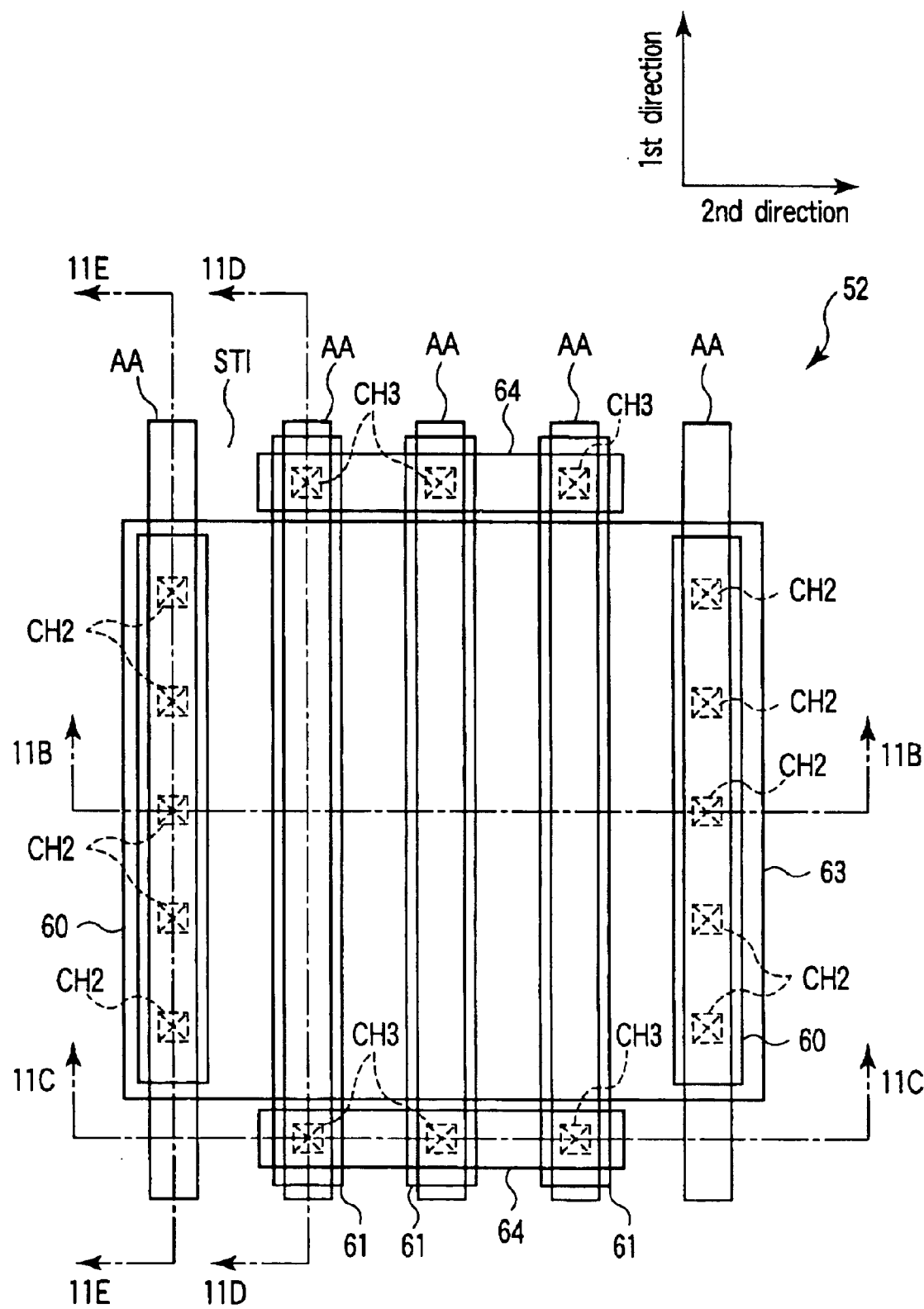
FIG. 11A is a sectional view of a capacitor element included in a boosting circuit provided in a flash memory according to a third embodiment of the present invention.

Next, a nonvolatile semiconductor memory device according to a third embodiment of the present invention will be explained. The third embodiment is such that the polycrystalline silicon layer 61 is divided into pieces corresponding to individual element regions in a modification of the second embodiment. Since the remaining configuration is the same as that of the first embodiment, explanation of them will be omitted. FIG. 11A is a plan view of a capacitor element 52 included in each of a first and a second boosting circuit 17, 18 provided in a flash memory of the third embodiment.

As shown in FIG. 11A, a plurality of stripe-like element regions AA extending in a first direction are formed in a second direction in the semiconductor substrate 100. Stripe-like polycrystalline silicon layers 60, 61 are formed on the element regions AA, with a gate insulating film interposed therebetween. The polycrystalline silicon layers 60 are positioned at both ends of the capacitor element 52 in the second direction, whereas the polycrystalline silicon layers 61 are positioned between the two polycrystalline silicon layers 60. The polycrystalline silicon layers 61 are formed so as to be longer than the polycrystalline silicon layers 60 in the first direction. A polycrystalline silicon layer 63 is formed on the polycrystalline silicon layers 60, 61 and element isolating region STI, with a capacitor insulating film interposed therebetween. The polycrystalline silicon layer 63 covers the polycrystalline silicon layers 60. Since the polycrystalline silicon layer 61 is longer than the polycrystalline silicon layer 60 in the first direction, the polycrystalline silicon layers 61 are not covered completely with the polycrystalline silicon layer 63. Both ends of the polycrystalline silicon layer 61 project outside the polycrystalline silicon layer 63. In the projecting regions, polycrystalline silicon layers 64 are formed, with a capacitor insulating film interposed therebetween. The polycrystalline silicon layers 64 are formed so as to cross a plurality of polycrystalline silicon layers 61.

On the polycrystalline silicon layers 60, part of the capacitor isolating film is removed, thereby making contact holes CH2. The polycrystalline silicon layers 60, 63 are connected via the contact hole CH2. On the polycrystalline silicon layers 61 in the regions projecting from the polycrystalline silicon layers 63, too, part of the capacitor insulating film is removed, thereby making contact holes CH3. Polycrystalline silicon layers 61, 64 are connected via the contact hole CH3.

Figure 11B:
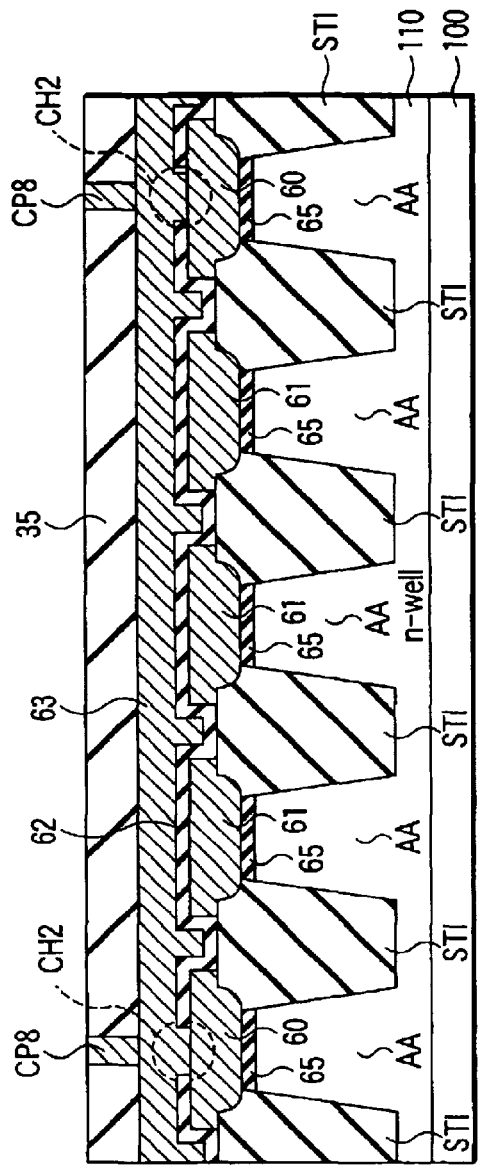
FIG. 11B is a sectional view taken along line 11B—11B of FIG. 11A.
Figure 11C:
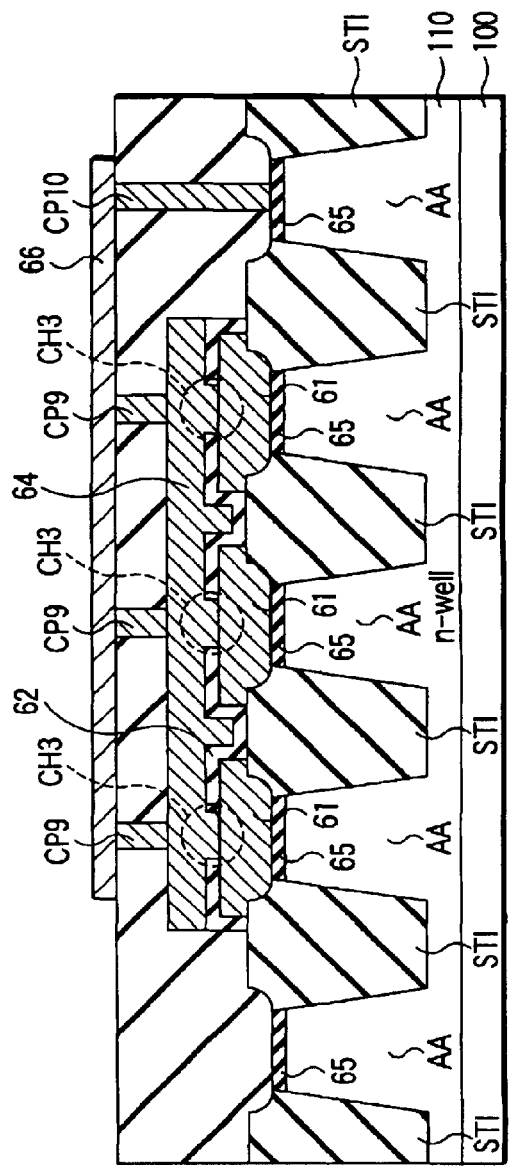
FIG. 11C is a sectional view taken along line 11C—11C of FIG. 11A.
Figure 11D:
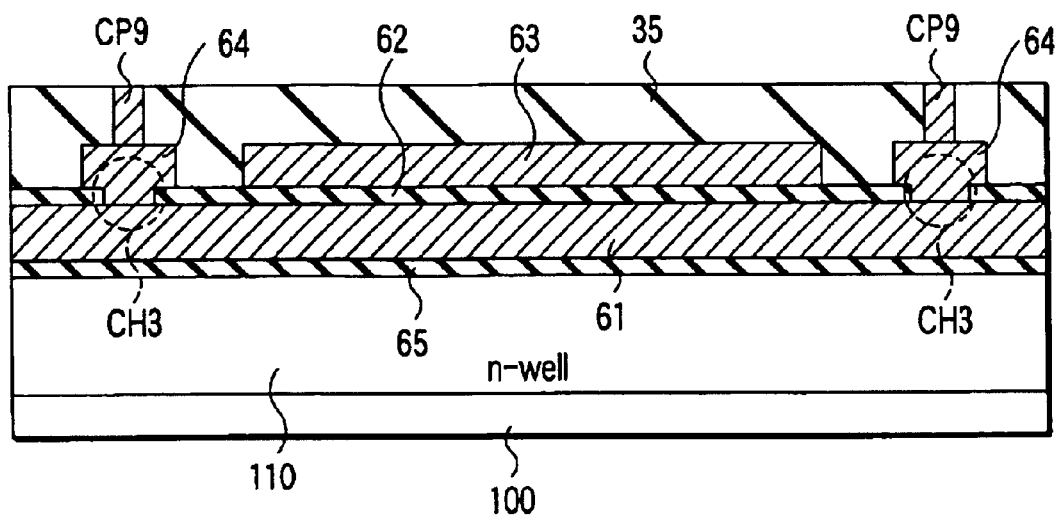
FIG. 11D is a sectional view taken along line 11D—11D of FIG. 11A.
Figure 11E:
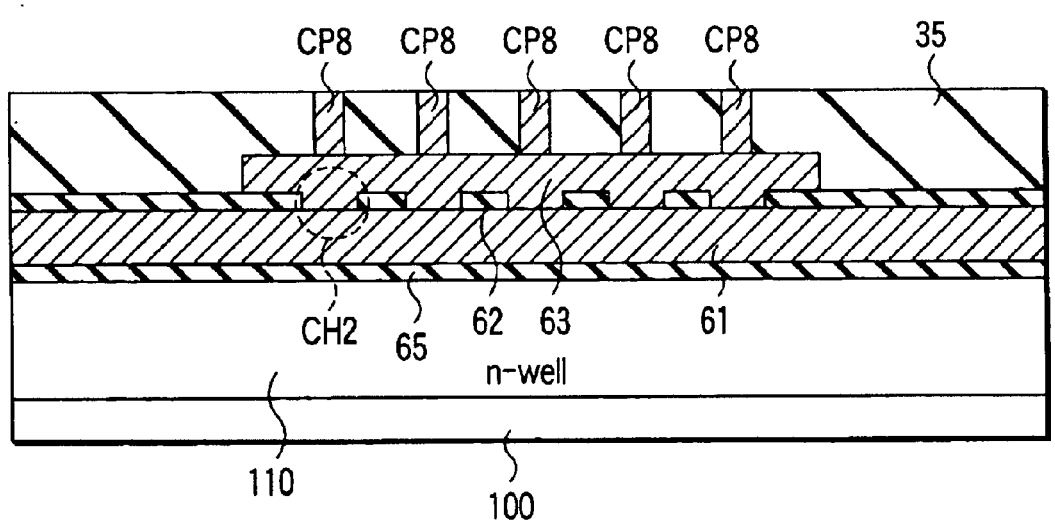
FIG. 11E is a sectional view taken along line 11E—11E of FIG. 11A.

A sectional configuration of the capacitor element configured as described above will be explained by reference to FIGS. 11B to 11E. FIG. 11B is a sectional view taken along line 11B—11B of FIG. 11A. FIG. 11C is a sectional view taken along line 11C—11C of FIG. 11A. FIG. 11D is a sectional view taken along line 11D—11D of FIG. 11A. FIG. 11E is a sectional view taken along line 11E—11E of FIG. 11A.

As shown in the figures, an n-well region 110 is formed in the semiconductor substrate 100. Stripe-like element isolating regions STI are formed in the n-well region 110. The stripe-like polycrystalline silicon layers 61, 60 extending in the first direction are formed on the element regions AA with gate insulating film 65 interposed therebetween. The polycrystalline silicon layers 61, 60 are isolated from one another in such a manner that they correspond to the element regions AA in a one-to-one correspondence. Furthermore, a capacitor insulating film 62 is formed on the top and side of each of the polycrystalline silicon layers 61, 60, on the element isolating region between the polycrystalline silicon layers 61, 60, and on the element isolating region between the polycrystalline silicon layers 60, 60. The capacitor insulating film 62 is formed of, for example, an ONO film, an ON film, or an NO film, which is the same material as that of the inter-gate insulating film of the memory cell. Part of the capacitor insulating film 62 is removed above the polycrystalline silicon layer 60, thereby making contact holes CH2. Above the polycrystalline silicon layers 61, too, the capacitor insulating film 62 is removed in part at both ends in the first direction, thereby making contact holes CH3. Then, polycrystalline silicon layers 63, 64 are formed on the capacitor insulating film 62. The polycrystalline silicon layers 63, 64 are isolated from each other and are connected to the polycrystalline silicon layers 60, 61 via the contact holes CH2, CH3, respectively. With the above configuration, the polycrystalline silicon layer 61 functions as one electrode of the capacitor element 52, whereas the polycrystalline silicon layers 63, 60 function as the other electrode of the capacitor element 52.

Furthermore, an interlayer insulating film 35 is formed on the semiconductor substrate 100 so as to cover the capacitor element 52 configured as described above. Contact plugs CP8, CP9 are formed in the interlayer insulating film 35 so as to be connected to the polycrystalline silicon layers 63, 64, respectively.

In the capacitor element 52 with the above configuration, the n-well region 110 and the polycrystalline silicon layer 61 are set at the same potential. To bring both of the well region 100 and layer 61 to the same potential, the n-well region 110 is drawn up to the surface of the semiconductor substrate 100. Then, the n-well region 110 is connected electrically to the polycrystalline silicon layer 64 via the contact plug CP10, metal wiring layer 66, and contact plug CP9.

Next, a method of manufacturing memory cells MC and capacitor elements 52 in the boosting circuits 17, 18 in the flash memory with the above configuration will be explained by reference to FIGS. 12A to 12F. FIGS. 12A to 12F are sectional views showing fabrication steps of the flash memory of the third embodiment sequentially. The memory cell array regions in FIGS. 12D and 12E are sectional views taken along line 2C—2C of FIG. 2A. The memory cell array regions in FIGS. 12A, 12B, 12C, and 12F are sectional views taken along line 2B—2B of FIG. 2A. The region in which a capacitor element 52 is to be formed is a sectional view taken along line 11B—11B of FIG. 11A.

As shown in FIG. 12A, element isolating regions STI are formed in the semiconductor substrate 100 by STI techniques. Then, stripe-like element regions AA are formed in a memory cell array region and in a region where a capacitor element is to be formed.

Next, as shown in FIG. 12B, gate insulating films 30 are formed on the semiconductor substrate 100 by thermal oxidation techniques or the like. The gate insulating films 30 correspond to the gate insulating films 65 explained in FIGS. 11B to 11E. Then, a polycrystalline silicon layer 31 is formed on the gate insulating films 30. The polycrystalline silicon layer 31 functions as the floating gate of a memory cell transistor MT.

Figure 12C:
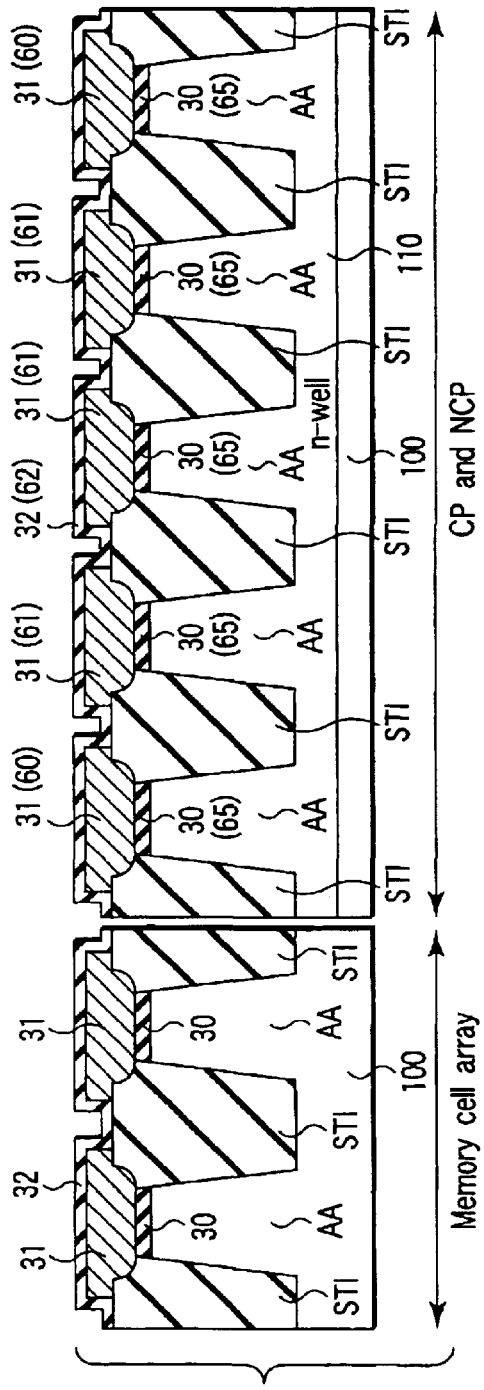
Figure 12D:
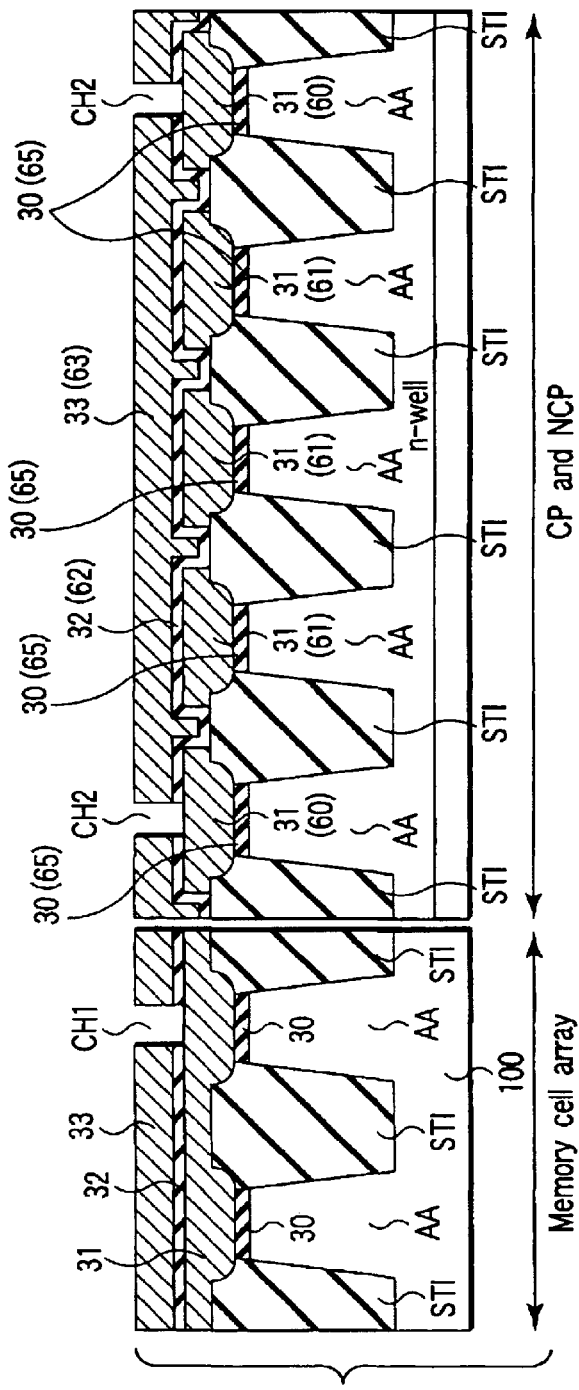
Figure 12E:
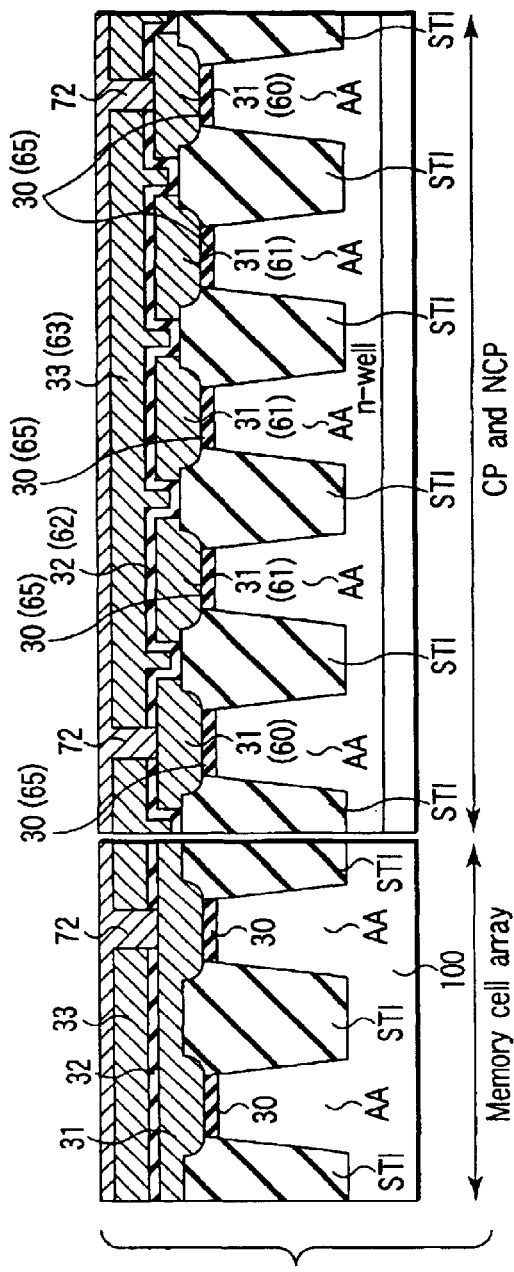

Next, as shown in FIG. 12C, the polycrystalline silicon layer 31 is patterned by photolithographic techniques and RIE techniques. As a result, in the memory cell array region and the region where a capacitor element is to be formed, the polycrystalline silicon layer 31 is divided into parts corresponding to individual element regions. In the region where a capacitor element is to be formed, the polycrystalline silicon layers located at both ends correspond to the polycrystalline silicon layers 60 explained in FIGS. 11B to 11E. The polycrystalline silicon layers 31 existing between the polycrystalline silicon layers 60 correspond to the polycrystalline silicon layers 61. Then, an ONO film 32 is formed on the polycrystalline silicon layers 31 and the element isolating regions STI by, for example, CVD. Of course, an ON film or an NO film may be used in place of the ONO film. The ONO film 32 functions as an inter-gate insulating film in the memory cell array region and as a capacitor insulating film 62 in the region where a capacitor element 52 is to be formed.

Next, as explained in the first embodiment, the gate insulating film 30, polycrystalline silicon layer 31, and ONO film 32 in the peripheral circuit region are removed by etching. Then, a gate insulating film is formed on the semiconductor substrate 100 in the peripheral circuit region by thermal oxidation techniques or the like. Then, A polycrystalline silicon layer 33 is formed on the ONO film 32 and the gate insulating film in the peripheral circuit region by CVD techniques or the like.

Next, as shown in FIG. 12D, the polycrystalline silicon layer 33 and ONO film 32 are etched by photolithographic techniques and RIE techniques. As a result, a contact hole CH1 reaching the polycrystalline silicon layer 31 is made in the shunt region of the select transistor. At the same time, contact holes CH2, CH3 reaching the polycrystalline silicon layer 31 (at both ends of the polycrystalline silicon layer 61 and polycrystalline silicon layer 60) are made in the region where a capacitor element 52 is to be formed.

Next, as shown in FIG. 12E, a polycrystalline silicon layer 72 is formed on the polycrystalline silicon layer 33 by CVD techniques or the like, thereby filling in the contact holes CH1 to CH3. As a result, the polycrystalline silicon layers 31, 33 are connected in the select transistor ST and capacitor element 52.

Then, in the memory cell array region, the polycrystalline silicon layers 33, 31, 72, and inter-gate insulating film 32 are patterned by photolithography and RIE, thereby forming stripe-like multilayer gates. Then, in the peripheral circuit region, the polycrystalline silicon layer 33 is patterned into a gate-electrode pattern. As explained in the first embodiment, when the peripheral circuit region is patterned, the polycrystalline silicon layer 33 of the capacitor element 52 is also patterned. As a result, the polycrystalline silicon layer 33 of the capacitor element 52 is divided in two, one (63) connected to the polycrystalline silicon layer 31 (60) and the other (64) connected to the polycrystalline silicon layer 31 (61).

Figure 12F:
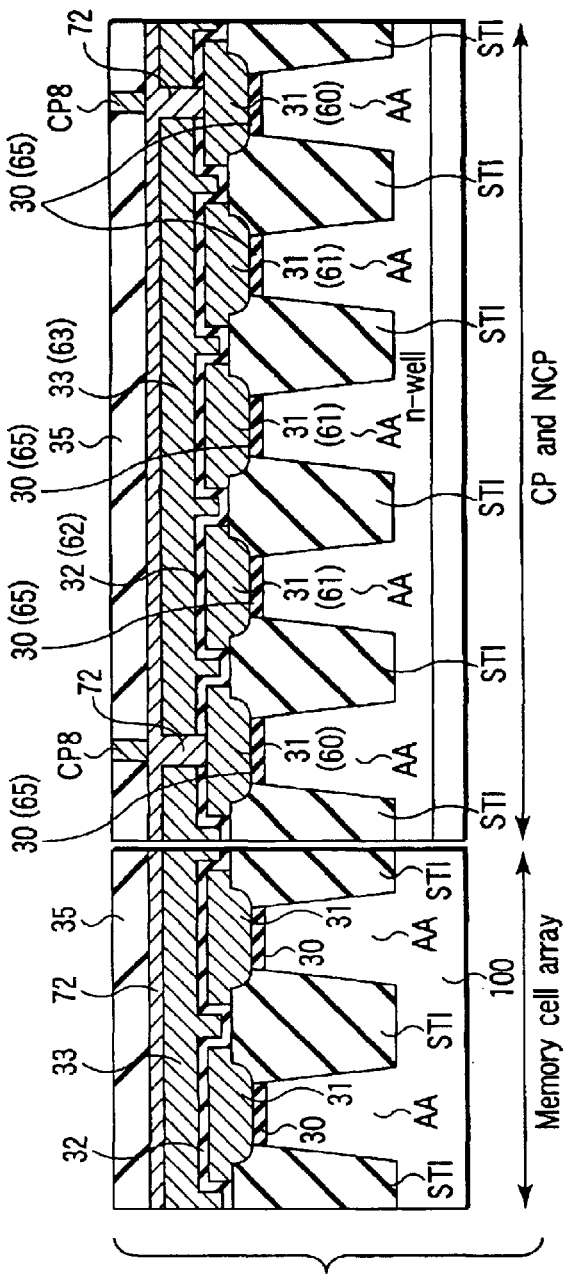

Thereafter, the source and drain regions of the memory cell transistors, select transistors and MOS transistors in the peripheral circuit region are formed. Then, as shown in FIG. 12F, an interlayer insulating film 35 is formed on the semiconductor substrate 100 so as to cover the memory cell transistors, select transistors, capacitor elements 52, and the MOS transistors in the peripheral circuit region. Contact plugs CP1, CP3, CP5, CP8, CP9 are also formed at the same time. Furthermore, an interlayer insulating film, contact plugs, and a metal wiring layer are formed, which completes a flash memory 10.

As described above, the flash memory of the third embodiment produces not only the effect explained in item (4) in the second embodiment but also the effects explained in the following items (5) and (6).

(5) The process of manufacturing flash memories can be simplified.

As shown in FIG. 11B, the capacitor element 52 in the boosting circuit provided in the flash memory of the third embodiment includes the polycrystalline silicon layer 60, 61, 63 and the capacitor insulating film 62. The polycrystalline silicon layer 61 acting as one electrode of the capacitor element 52 is separated into element regions. The capacitor insulating film is formed on the top and side of the polycrystalline silicon layer 61 and on the element isolating region STI between the polycrystalline silicon layers 61, and further on the top and side of the polycrystalline silicon layer 60 and on the element isolating region STI between the polycrystalline silicon layers 60, 61. Then, the polycrystalline silicon layer 63 acting as the other electrode of the capacitor element 52 is formed on the capacitor insulating film 62. This structure is identical with that of the floating gate 31, inter-gate insulating film 32, and control gate 33 of a memory cell in the memory cell array (see FIG. 2B). The inter-gate insulating film 32 and capacitor insulating film 62 are made of the same material. That is, the capacitor insulating film 62 has the same structure and characteristic as those of the inter-gate insulating film 32 all over the region, not only in the place where an electric field concentrates most. Therefore, the step of testing the reliability of the inter-gate insulating film 32 and the step of testing the reliability of the capacitor insulating film 62 can be carried out in the same step. As a result, the flash memory fabrication steps can be simplified.

As described in item (1) in the first embodiment, the above effect can be realized without an increase in the fabrication steps.

(6) The capacitance of the capacitor element can be increased.

As shown in FIG. 11B, in the capacitor element 52 of the third embodiment, the polycrystalline silicon layers 61 are separated from one another so as to correspond to individual element regions. Accordingly, not only the top of the polycrystalline silicon layer 61 but also its sides contribute to the capacitance of the capacitor element. In other words, the electrode area of the capacitor increases merely by the presence of the sides of the polycrystalline silicon layer 61. As a result, the capacitance of the capacitor element 52 can be made larger.

As described above, with nonvolatile semiconductor memory devices according to the first to third embodiments, the flash memory fabrication processes can be simplified. Specifically, the same structure as that of at least the region where an electric field concentrates most in the inter-gate insulating film 32 of the memory cell is also formed in the capacitor insulating film 62 of the capacitor element 52. Therefore, the inter-gate insulating film of the memory cell and the capacitor insulating film 62 of the capacitor element 52 have the same reliability. Accordingly, the step of testing the reliability of each of them can be carried out in the same step. Furthermore, since the capacitor element 52 can be formed in the step of fabricating the memory cells and peripheral circuit, the above effect is produced without an increase in the number of steps.

In the above embodiments, a stitch region SA1 is provided for every eight columns of memory cells. The frequency of arrangement of stitch regions may be changed according to the required reading speed as follows: a stitch region SA1 is provided for every 64 columns of memory cells, 128 columns of memory cells, or 256 columns of memory cells.

Figure 13:
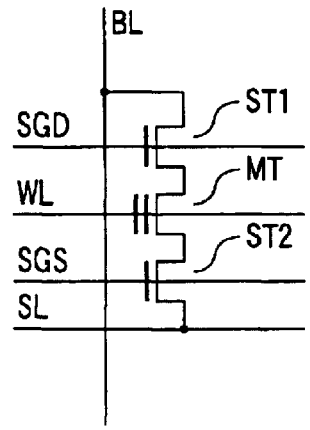
FIG. 13 is a circuit diagram of a memory cell in a flash memory according to a first modification of each of the first to third embodiments.
Figure 14:
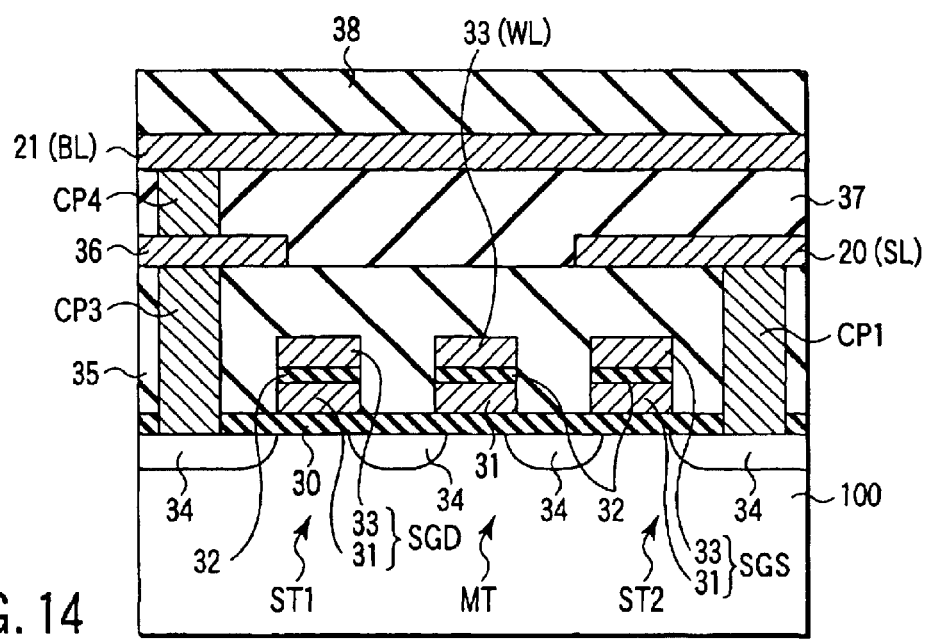
FIG. 14 is a sectional view of a memory cell in the flash memory according to the first modification of each of the first to third embodiments.

Furthermore, in the above embodiments, a flash memory has memory cells, each including two transistors, a select transistor ST and a memory cell transistor MT. The embodiment is not restricted to this. For instance, as shown in FIGS. 13 and 14, the embodiment may be applied to a flash memory that has memory cells, each including three transistors, two select transistors ST1, ST2 and a memory cell transistor MT.

The memory cell is such that three transistors are connected in series in such a manner a memory cell transistor MT is sandwiched between two select transistors ST1, ST2. The drain region of the select transistor ST1 is connected to a bit line. The source region of the select transistor ST2 is connected to a source line. The gate of the memory cell transistor MT is connected to a word line. The gates of the select transistors ST1, ST2 are connected to select gate lines SGD, SGS, respectively. FIG. 14 shows a cross-sectional structure. Specifically, three polycrystalline silicon layers 31 are formed on the semiconductor substrate 100 with a gate insulating film 30 interposed therebetween. A polycrystalline silicon layer 33 is formed on each of the polycrystalline silicon layers 31 with an inter-gate insulating film 32 interposed therebetween. In a memory cell transistor MT, the polycrystalline silicon layers 31 are isolated from one another so as to correspond to individual memory cell transistors. They function as floating gates. The polycrystalline silicon layer 33 functions as a control gate (word line). In the select transistors ST1, ST2, the polycrystalline silicon layers 31 are connected in common between select transistors in the direction of word line. They, together with the polycrystalline silicon layer 33, function as select gate lines SGD, SGS. The inter-gate insulating films 32 of the select transistors ST1, ST2 are removed in part in a stitch region (not shown), thereby connecting the polycrystalline silicon layers 31, 33. Then, the drain region 34 of the select transistor ST1 is connected to a bit line 21 via the contact plugs CP3, CP4 and metal wiring layer 36. The source region 34 of the select transistor ST2 is connected to a source line 20 via the contact plug CP1.

Figure 15:
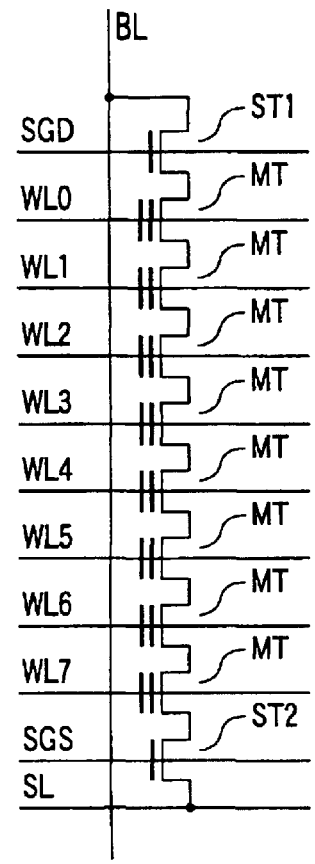
FIG. 15 is a circuit diagram of a memory cell in a flash memory according to a second modification of each of the first to third embodiments.
Figure 16:
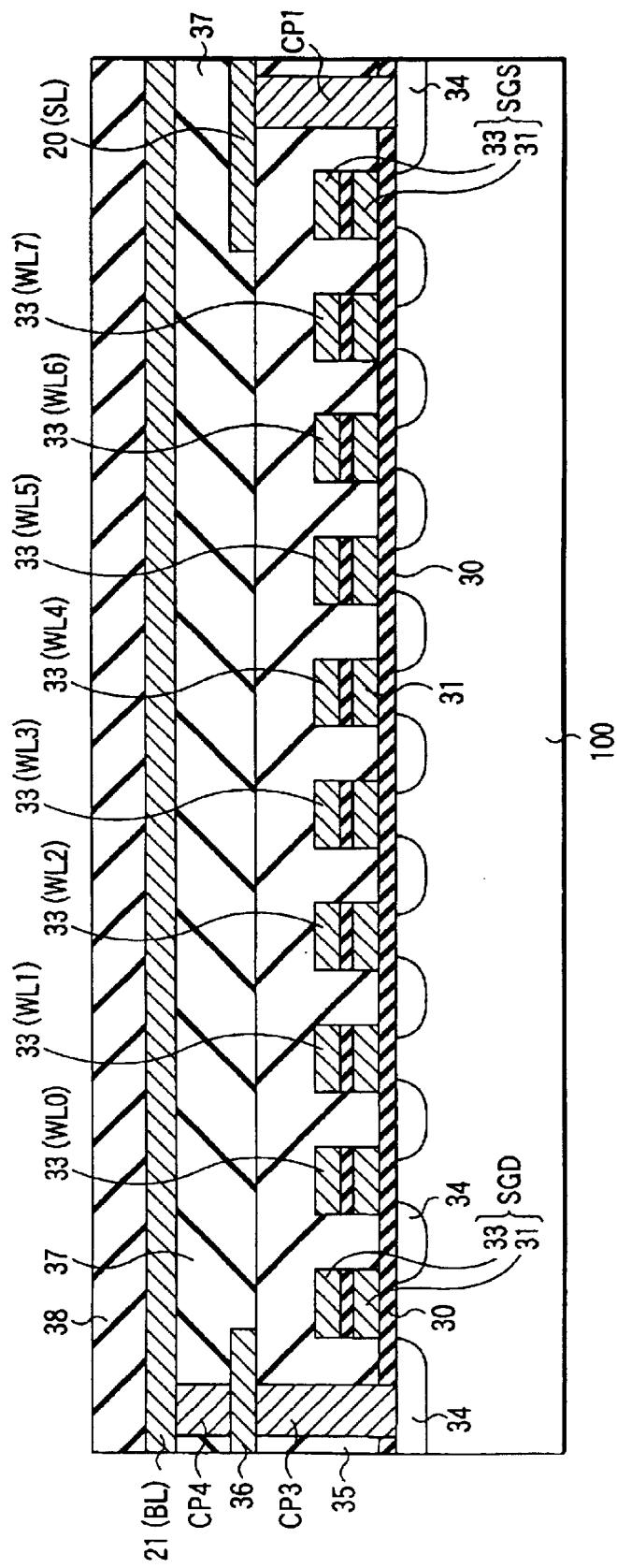
FIG. 16 is a sectional view of a memory cell in the flash memory according to the second modification of each of the first to third embodiments.

The embodiment may be applied to not only a flash memory that has memory cells, each including three transistors, but also a NAND flash memory as shown in FIG. 15 or 16. A NAND cell is such that a plurality of memory cell transistors MT are connected in series between two select transistors ST1, ST2. While in FIGS. 15 and 16, eight memory cell transistors are connected in series, the number of memory cell transistors may not be limited to this, and may be 16 or 32. The drain region of the select transistor ST1 is connected to a bit line. The source region of the select transistor ST2 is connected to a source line. The gate of the memory cell transistor MT is connected to a word line. The gates of the select transistors ST1, ST2 are connected to the select gate lines SGD, SGS, respectively. FIG. 16 shows a cross-sectional structure, which is the same as that of FIG. 14 except that the number of memory cell transistors MT is increased.

Furthermore, the first to third embodiments may also be applied to a system LSI.

Figure 17:
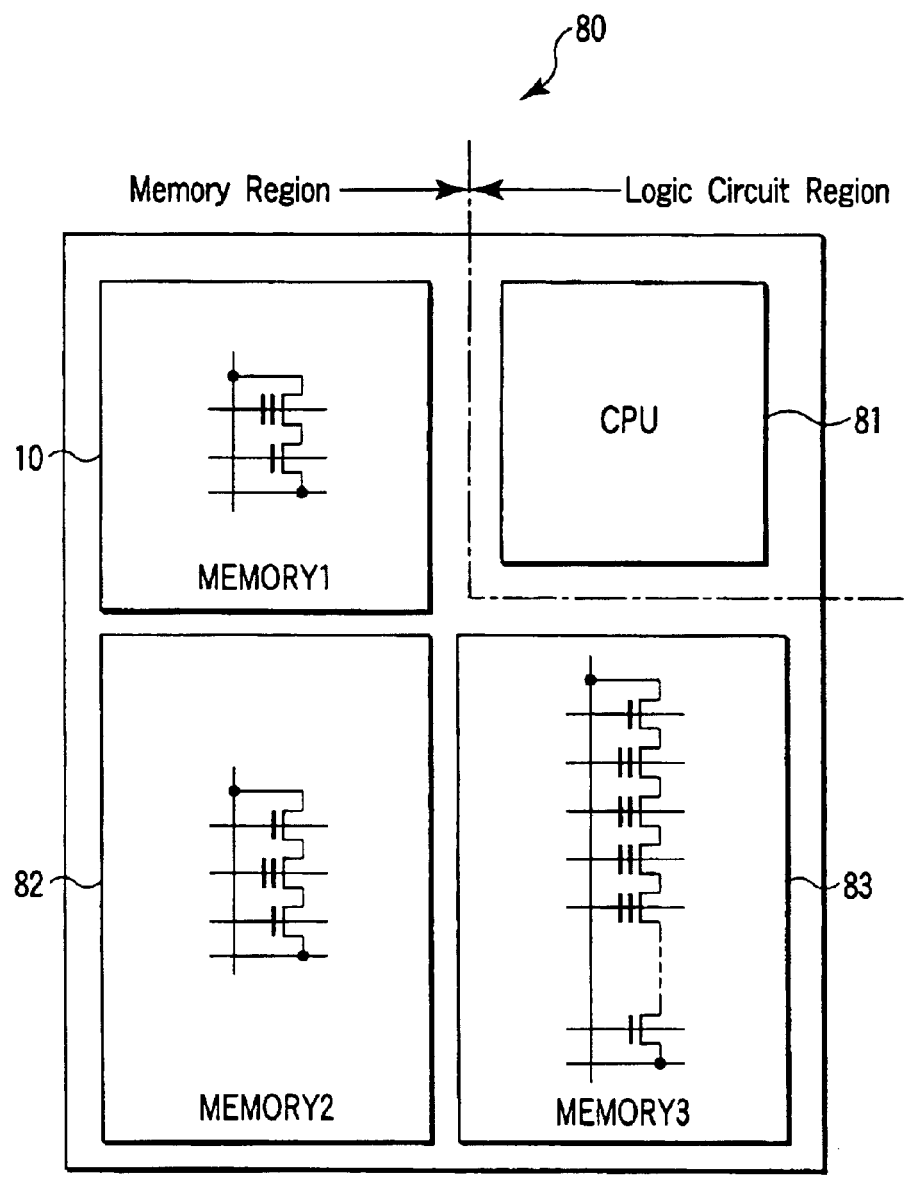
FIG. 17 is a block diagram of a system LSI including a flash memory according to a third modification of each of the first to third embodiments.

FIG. 17 is a block diagram of a system LSI. As shown in the figure, a system LSI 180 has a logic circuit region and a memory region. In the logic circuit region, for example, a CPU 81 is provided. In the memory region, there are provided a flash memory 10 explained in the first to third embodiments, a flash memory 82 including three MOS transistors explained by reference to FIGS. 13 and 14, and a NAND flash memory 83 explained by reference to FIGS. 15 and 16. In a memory cell of the flash memory 10, the number of transistors connected in series is two. As a result, the current driving capability of the memory cell is greater than that of the other types of memory cells. Thus, the flash memory 10 is suitable for high-speed reading. When the flash memory is provided on the same chip as the CPU 81 as shown in FIG. 17, the flash memory 10 can be used as a ROM that stores the firmware for the CPU 81. Since the flash memory 10 has a high operating speed, the CPU 81 can read the data directly without the intervention of RAM or the like. This makes a RAM or the like unnecessary, which improves the operating speed of the system LSI. The flash memory 10 can be formed in the same fabrication processes as the NAND flash memory 82 and flash memory 83. For instance, the process of implanting ions to form an impurity diffused layer, the process of patterning gate electrodes and metal wiring layers, and the like can be carried out at the same time for three types of flash memories. In this case, for example, the impurity diffused layers have the same concentration in the individual memories. Since three flash memories provided in an LSI are formed in the same processes, the manufacture of LSIs can be simplified.

For example, in the logic circuit region, the CPU 81 may be formed on an SOI substrate and, in the memory region, the individual memories 10, 82, 83 may be formed on a bulk silicon substrate.

In the first to third embodiments, the capacitor element included in the boosting circuit has the same structure as that of the memory cell. However, the first to third embodiments are not restricted to the capacitor element in the boosting circuit and may be applied to any capacitor element that has a capacitor insulating film made of the same material as that of the inter-gate insulating film of the memory cell.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
    memory cells each of which includes a first MOS transistor having a charge accumulation layer and a control gate formed on the charge accumulation layer with an inter-gate insulating film interposed therebetween; and
    a boosting circuit which generates a voltage supplied to the memory cells and includes a capacitor element, the capacitor element including
        a first and a second semiconductor layer which are formed on a semiconductor substrate and separated from each other,
        a capacitor insulating film which is formed on the top and side of each of the first and second semiconductor layers and on the semiconductor substrate between the first and second semiconductor layers and which is made of the same material as that of the inter-gate insulating film, and
        a third semiconductor layer which is formed on the capacitor insulating film and which is connected electrically to the first semiconductor layer and isolated electrically from the second semiconductor layer.

2. The nonvolatile semiconductor memory device according to claim 1, further comprising:
    a memory cell array which has the memory cells arranged in matrix and which has columns of the memory cells separated from one another by first element isolating regions; and
    word lines each of which is formed by connecting the control gates of the first MOS transistors in the same row in common, wherein
    between the first MOS transistors adjacent to one another in the direction of the word line, the charge accumulation layers are separated from one another and the inter-gate insulating film is formed on the top and side of the charge accumulation layer and on the first element isolating region between the charge accumulation layers.

3. The nonvolatile semiconductor memory device according to claim 2, wherein
    each of the memory cells further includes a second MOS transistor which has one end of its current path connected to one end of the current path of the first MOS transistor,
    the nonvolatile semiconductor memory device further comprises
        bit lines each of which connects the other ends of the current paths of the first MOS transistors of the memory cells in the same column in common,
        a source line which connects the other ends of the current paths of the second MOS transistors in common,
        select gate lines each of which is formed by connecting the gates of the second MOS transistors of the memory cells in the same row in common,
        a column decoder which selects any one of the bit lines,
        a first row decoder which selects any one of the word lines, and a second row decoder which selects any one of the select gate lines, and the boosting circuit generates a voltage supplied to the first row decoder.

4. The nonvolatile semiconductor memory device according to claim 1, wherein the second semiconductor layer is formed on an element region with an insulating film interposed therebetween, the element region being formed in the semiconductor substrate, the insulating film being made of the same material as that of the gate insulating film of the memory cell.

5. The nonvolatile semiconductor memory device according to claim 1, wherein the second semiconductor layer is formed on a plurality of element regions with an insulating film interposed therebetween, the element regions being formed in the semiconductor substrate and electrically isolated from one another by second element isolating regions, the insulating film being made of the same material as that of the gate insulating film of the memory cell.

6. The nonvolatile semiconductor memory device according to claim 1, wherein the second semiconductor layer is formed on a third element isolating region formed in the semiconductor substrate.

7. The nonvolatile semiconductor memory device according to claim 1, wherein the dielectric breakdown voltage of a capacitor structure including the charge accumulation layer, the inter-gate insulating film, and the control gate is the same as that of the capacitor element.

8. A nonvolatile semiconductor memory device comprising:

a plurality of memory cells each of which includes a first MOS transistor having a stacked gate including a charge accumulation layer and a control gate formed on the charge accumulation layer with an inter-gate insulating film interposed therebetween;

a memory cell array which has the memory cells arranged in a matrix;

bit lines each of which electrically connects the drain regions of the first MOS transistors of the memory cells in the same column in common;

word lines each of which connects the control gates of the first MOS transistors of the memory cells in the same row in common;

a source line which electrically connects the source regions of said plurality of memory cells in common;

a column decoder which selects any one of the bit lines;

a first row decoder which selects any one of the word lines; and a boosting circuit which generates a voltage supplied to the first row decoder and which has a capacitor element including a capacitor insulating film made of the same material as that of the inter-gate insulating film, a part of the capacitor insulating film having the same structure as that of a place where an electric field concentrates most in the inter-gate insulating film.

9. The nonvolatile semiconductor memory device according to claim 8, wherein the capacitor element includes a first and a second semiconductor layer which are formed on the semiconductor substrate and separated from each other, a capacitor insulating film which is formed on the top and side of each of the first and second semiconductor layers and on the semiconductor substrate between the first and second semiconductor layers and which is made of the same material as that of the inter-gate insulating film, and a third semiconductor layer which is formed on the capacitor insulating film and which is connected electrically to the first semiconductor layer and isolated electrically from the second semiconductor layer, and between the first MOS transistors adjacent to one another in the direction of word line, the charge accumulation layers are separated from one another and the inter-gate insulating film is formed on the top and side of each of the charge accumulation layers and on a first element isolating region formed between the charge accumulation layers.

10. The nonvolatile semiconductor memory device according to claim 9, wherein the second semiconductor layer is formed on an element region with an insulating film interposed therebetween, the element region being formed in the semiconductor substrate, the insulating film being made of the same material as that of the gate insulating film of the memory cell.

11. The nonvolatile semiconductor memory device according to claim 10, wherein the second semiconductor layer and the element region are at the same potential.

12. The nonvolatile semiconductor memory device according to claim 9, wherein the second semiconductor layer is formed on a plurality of element regions with an insulating film interposed therebetween, the element regions being formed in the semiconductor substrate and electrically isolated from one another by second element isolating regions, the insulating film being made of the same material as that of the gate insulating film of the memory cell.

13. The nonvolatile semiconductor memory device according to claim 12, wherein the second semiconductor layer includes a plurality of fourth semiconductor layers isolated from one another, the fourth semiconductor layers being formed on the plurality of element regions in a one-to-one correspondence with the insulating film interposed therebetween, and the capacitor insulating film is formed on the top and side of each of the fourth semiconductor layers and on the second element isolating region between the fourth semiconductor layers.

14. The nonvolatile semiconductor memory device according to claim 13, wherein said plurality of fourth semiconductor layers are connected electrically in common.

15. The nonvolatile semiconductor memory device according to claim 9, wherein the second semiconductor layer is formed on a third element isolating region formed in the semiconductor substrate.

16. The nonvolatile semiconductor memory device according to claim 8, wherein each of the memory cells further includes a second MOS transistor which has a drain region is connected to the source region of the first MOS transistor, and the nonvolatile semiconductor memory device further comprises select gate lines each of which is formed by connecting the gates of the second MOS transistors of the memory cells in the same row in common, a source line which connects the source regions of the second MOS transistors in common; and a second row decoder which selects any one of the select gate lines, and the drain region of the first MOS transistor is connected to the bit line.

17. The nonvolatile semiconductor memory device according to claim 16, wherein the second semiconductor layer is formed on an element region with an insulating film interposed therebetween, the element region being formed in the semiconductor substrate, the insulating film being made of the same material as that of the gate insulating film of the memory cell.

18. The nonvolatile semiconductor memory device according to claim 17, wherein the second semiconductor layer and the element region are at the same potential.

19. The nonvolatile semiconductor memory device according to claim 16, wherein the second semiconductor layer is formed on a plurality of element regions with an insulating film interposed therebetween, the element region being formed in the semiconductor substrate and electrically isolated from one another by second element isolating regions, the insulating film being made of the same material as that of the gate insulating film of the memory cell.

20. The nonvolatile semiconductor memory device according to claim 19, wherein the second semiconductor layer includes a plurality of fourth semiconductor layers isolated from one another, the fourth semiconductor layers being formed on said plurality of element regions in a one-to-one correspondence, with the insulating film interposed therebetween, and the capacitor insulating film is formed on the top and side of each of the fourth semiconductor layers and on the second element isolating region between the fourth semiconductor layers.

21. The nonvolatile semiconductor memory device according to claim 20, wherein the plurality of fourth semiconductor layers are connected electrically in common.

22. The nonvolatile semiconductor memory device according to claim 16, wherein the second semiconductor layer is formed on a third element isolating region formed in the semiconductor substrate.

23. The nonvolatile semiconductor memory device according to claim 8, wherein the dielectric breakdown voltage of a capacitor structure including the charge accumulation layer, the inter-gate insulating film, and the control gate is the same as that of the capacitor element.

* * * * *